United States Patent
Suwabe

(10) Patent No.: US 10,972,049 B2
(45) Date of Patent: Apr. 6, 2021

(54) OSCILLATION APPARATUS

(71) Applicants: Kabushiki Kaisha Toshiba, Tokyo (JP); Toshiba Electronic Devices & Storage Corporation, Tokyo (JP)

(72) Inventor: Hiroyuki Suwabe, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/814,312

(22) Filed: Mar. 10, 2020

(65) Prior Publication Data

US 2021/0067092 A1  Mar. 4, 2021

(30) Foreign Application Priority Data

Sep. 4, 2019  (JP) .............................. JP2019-161337

(51) Int. Cl.
*H03B 5/04* (2006.01)
*H03F 1/30* (2006.01)
*H03F 3/16* (2006.01)

(52) U.S. Cl.
CPC ............... *H03B 5/04* (2013.01); *H03F 1/301* (2013.01); *H03F 3/16* (2013.01); *H03F 2200/447* (2013.01)

(58) Field of Classification Search
CPC ....................................................... H03B 5/04
USPC .......................................................... 331/66
See application file for complete search history.

(56) References Cited

U.S. PATENT DOCUMENTS

| | | | |
|---|---|---|---|
| 7,592,877 B2 | 9/2009 | Shiramizu et al. | |
| 7,625,118 B2 | 12/2009 | Mizuno | |
| 8,058,941 B2 | 11/2011 | Kurogo et al. | |
| 9,276,585 B2 | 3/2016 | Nakamura et al. | |
| 2006/0202772 A1* | 9/2006 | Ishikawa ................ | H03B 5/368 331/176 |
| 2014/0218123 A1* | 8/2014 | Wei ......................... | H03B 5/04 331/176 |
| 2016/0352223 A1* | 12/2016 | Choo ...................... | G05F 1/563 |

(Continued)

FOREIGN PATENT DOCUMENTS

| | | |
|---|---|---|
| JP | 2002-300027 A | 10/2002 |
| JP | 3559739 B2 | 9/2004 |
| JP | 2008-17007 A | 1/2008 |

(Continued)

*Primary Examiner* — Joseph Chang
(74) *Attorney, Agent, or Firm* — White & Case LLP

(57) ABSTRACT

An oscillation apparatus includes a correction circuitry including a first amplifier and a second amplifier, and an oscillation circuitry. The first amplifier amplifies a difference between a first voltage having a first temperature characteristic and a second voltage having a second temperature characteristic different from the first temperature characteristic to generate a third voltage having a third temperature characteristic different from both the first temperature characteristic and the second temperature characteristic. The second amplifier amplifies a difference between a sum of the second voltage and the third voltage, and, a feedback voltage, to generate a fourth voltage which corrects an oscillation frequency of an oscillation voltage. The oscillation circuitry outputs the oscillation voltage controlled in frequency based on the fourth voltage.

9 Claims, 18 Drawing Sheets

(56) References Cited

U.S. PATENT DOCUMENTS

2018/0076776 A1* 3/2018 Yabe .................. H03F 3/45475
2019/0199287 A1* 6/2019 Kuwano .................. H03B 5/04

FOREIGN PATENT DOCUMENTS

| JP | 2010-130141 A | 6/2010 |
|----|---------------|--------|
| JP | 4991193 B2 | 8/2012 |
| JP | 5411415 B2 | 2/2014 |
| JP | 6185741 B2 | 8/2017 |

* cited by examiner

OSCILLATION APPARATUS

CROSS REFERENCE TO RELATED APPLICATIONS

This application is based upon and claims the benefit of priority from the prior Japanese Patent Application No. 2019-161337, filed on Sep. 4, 2019, the entire contents of which are incorporated herein by reference.

FIELD

The embodiments of the present invention relate to an oscillation apparatus.

BACKGROUND

An oscillation circuitry is, for example, a circuitry which generates a clock signal being a reference for the operation of an electronic circuitry, and serves an important role in the electronic circuitry. Therefore, an output of the oscillation circuitry is required to have a high accuracy such as an error in frequency of a signal to be output of, for example, 0.5% or less irrespective of temperature. However, due to a temperature characteristic of a BGR (Band-Gap Reference) circuitry and a temperature characteristic of a resistance included in a circuitry which performs conversion between voltage and current, an error in voltage proportional to a square of a temperature change occurs, and an error also occurs in a frequency based on the error in voltage, resulting in a difficulty in keeping the accuracy.

DETAILED DESCRIPTION

Figure 1:
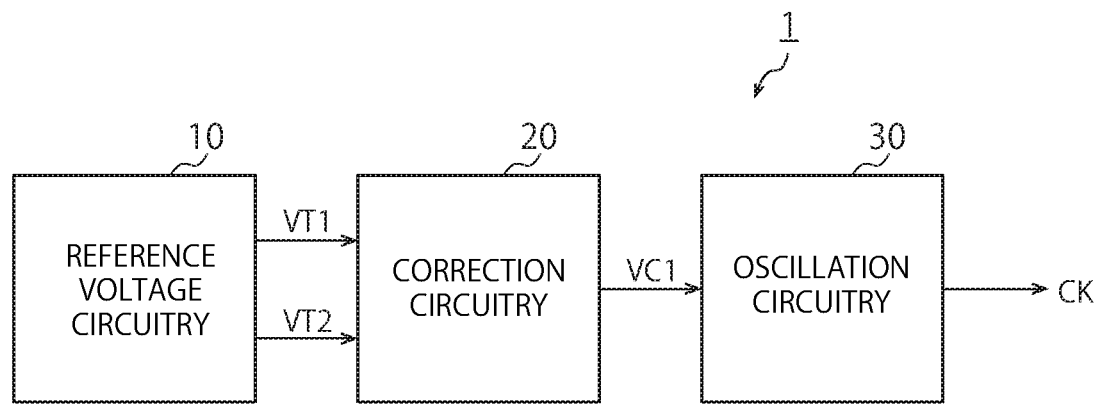
FIG. 1 is a block diagram schematically illustrating an oscillation apparatus according to an embodiment.

According to an embodiment, an oscillation apparatus includes a correction circuitry including a first amplifier and a second amplifier, and an oscillation circuitry. The first amplifier amplifies a difference between a first voltage having a first temperature characteristic and a second voltage having a second temperature characteristic different from the first temperature characteristic to generate a third voltage having a third temperature characteristic different from both the first temperature characteristic and the second temperature characteristic. The second amplifier amplifies a difference between a sum of the second voltage and the third voltage, and, a feedback voltage, to generate a fourth voltage which corrects an oscillation frequency of an oscillation voltage. The oscillation circuitry outputs the oscillation voltage controlled in frequency based on the fourth voltage.

Hereinafter, embodiments are explained referring to the drawings. Note that though coupling to a power supply voltage and to a ground voltage is sometimes omitted to simplify the explanation in the following explanation and the drawings except for the case where the explanation is particularly necessary, appropriate coupling has been made as needed. Further, the simple description of being grounded includes the case of being coupled to a power supply voltage Vss.

Figure 2:
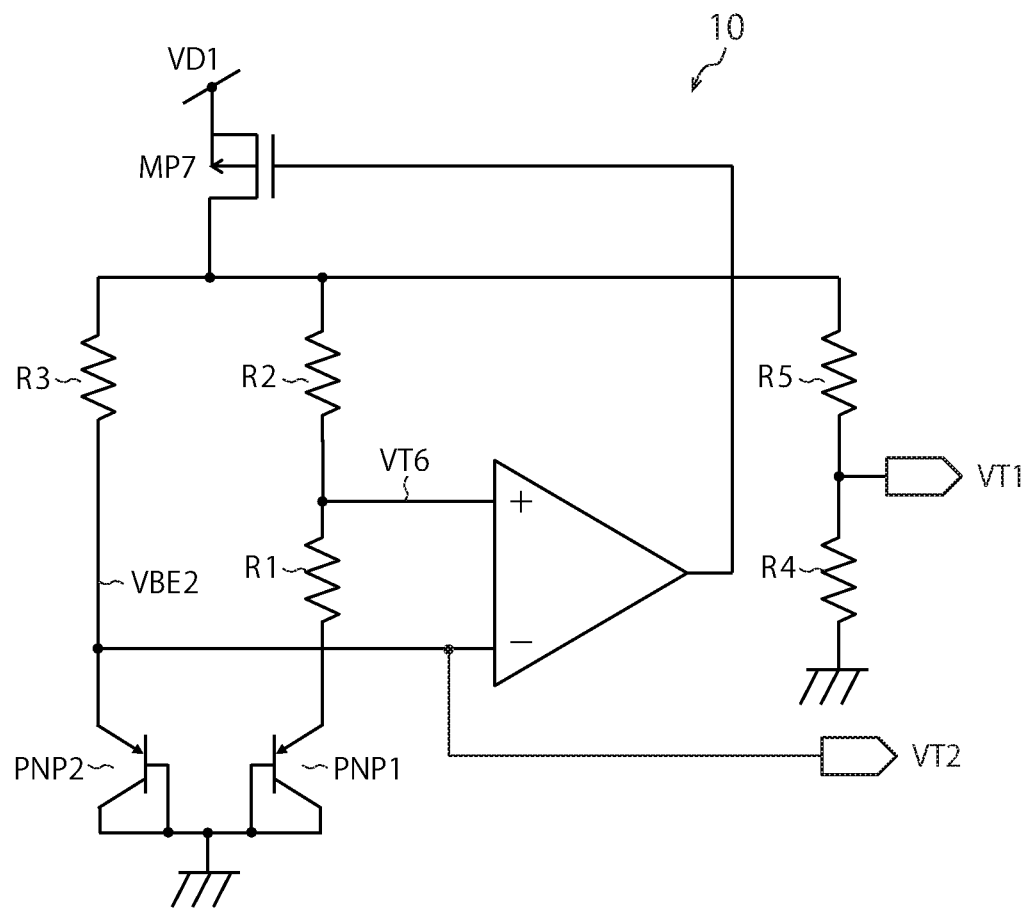
FIG. 2 is a circuitry diagram illustrating an example of a reference voltage circuitry according to an embodiment.

For example, in FIG. 2, a differential amplifier circuitry is coupled to the power supply voltage and to the ground voltage though not illustrated in the drawing. As just described, the coupling to the power supply is omitted in a buffer, an amplifier, a comparator, a logical operation circuitry and so on. Further, the case of the same word, for example, the same voltage, the same current, the same resistance value, or the same temperature characteristic in the explanation does not mean an exact match but is assumed to mean the same in a range including a slight difference due to a parasitic resistance, a parasitic capacitance and the like, and the individual difference of a circuitry element and the like. Further, the description of amplification more generally means multiplication by a gain and may have a wide meaning also including multiplication by a gain of less than 1, namely, attenuation.

First Embodiment

FIG. 1 is a block diagram schematically illustrating an oscillation apparatus according to this embodiment. An oscillation apparatus 1 includes a reference voltage circuitry 10, a correction circuitry 20, and an oscillation circuitry 30. The oscillation apparatus 1 is an apparatus (circuitry) which outputs a clock signal having a frequency characteristic stable irrespective of temperature.

The reference voltage circuitry 10 generates a reference voltage. The reference voltage to be generated is, for example, a BGR, and a first voltage VT1 and a second voltage VT2 being reference voltages are output. The first voltage VT1 has a first temperature characteristic and the second voltage VT2 has a second temperature characteristic. The first voltage characteristic and the second voltage characteristic are different.

The correction circuitry 20 is a circuitry which outputs, when the first voltage VT1 and the second voltage VT2 being the reference voltages are input, a fourth voltage VC1 having a voltage characteristic in which an offset having a characteristic of a square of temperature is superimposed on the first temperature characteristic. The fourth voltage VC1 has temperature dependence of canceling the effect regarding a square of a temperature change in voltage output from the reference voltage circuitry 10.

The oscillation circuitry 30 is a circuitry which outputs a clock signal controlled in frequency based on the fourth voltage VC1 output from the correction circuitry 20. When an error due to the temperature characteristic occurs in an input voltage, the oscillation circuitry 30 generates a disturbance in frequency to be output, based on the error.

FIG. 2 is a circuitry diagram illustrating an example of the reference voltage circuitry 10 according to this embodiment. The reference voltage circuitry 10 includes resistances R1, R2, R3, R4, R5, transistors PNP1, PNP2, an output transistor MP7, and a differential amplifier. The first voltage VT1 is a voltage made by voltage-dropping the same output voltage as that of a general BGR by the resistances R4, R5. On the other hand, the second voltage VT2 is a voltage which is to be negatively fed back in the general BGR but is output. Circuitry coefficients of the above circuitry elements are appropriately decided based on the voltage to be output or the like.

Further, in the reference voltage circuitry 10, resistance values are set, for example, not to cause a temperature inclination as much as possible for the first voltage VT1. In particular, the resistance values of the resistance R1 and the resistance R2 are set to values which theoretically stabilize the output voltage value in a required temperature zone, for example, between −40° C. to 125° C. (233K to 398K).

The resistance R1 has one terminal grounded via the transistor PNP1, and another terminal coupled to the resistance R2 and to a noninverting input terminal of the differential amplifier. The resistance R2 has one terminal coupled to the resistance R1, and another terminal coupled to an output terminal of the output transistor MP7. The resistance R3 has one terminal coupled to an inverting input terminal of the differential amplifier and to another output terminal of the reference voltage circuitry 10 and grounded via the transistor PNP2, and another terminal coupled to the output terminal of the output transistor MP7. The resistance R4 has one terminal coupled to the output terminal of the output transistor MP7 via the resistance R5, and another terminal grounded. Further, a node coupling the resistance R4 and the resistance R5 is coupled to one output terminal of the reference voltage circuitry 10.

For example, for the resistances R2, R3, resistances having the same characteristics (the same temperature characteristic and resistance value) are used. The ratio between the resistance values of the resistances R1 R2 is set so that the first voltage VT1 to be output becomes an output (having a small temperature inclination) stable with respect to the temperature. Besides, for example, the resistances R4, R5 are set so that the first voltage VT1 and the second voltage VT2 become equal voltages. More specifically, in addition to the equal voltages, the resistances R4, R5 are further set so that when the temperature is changed from low temperature to high temperature (for example, −40° C. to 125° C.), the high and low levels in voltage value are inverted at any of the temperatures. The difference between the first voltage VT1 and the second voltage VT2 may be about ±1 V in the range of −40° C. to 125° C. As a more concrete example, the first voltage VT1 may be about 0.7 V irrespective of the temperature, and the second voltage VT2 may be a voltage of about 0.8 V at −40° C. and a voltage of about 0.6 V at 125° C.

The transistors PNP1, PNP2 are, for example, bipolar type PNP transistors and are transistors whose bases and collectors are coupled, namely, diode-coupled transistors. As long as there are few problems in terms of semiconductor process or sufficient performance can be ensured, diodes may be used in place of them. The transistor PNP1 (first power supply transistor) has an emitter coupled to the resistance R1, and a collector and a base grounded. The transistor PNP2 (second power supply transistor) has an emitter coupled to the resistance R3, and a collector and a base grounded.

Note that in the drawing, one transistor is illustrated for each of the transistors PNP1, PNP2 but the transistors PNP1, PNP2 are not limited to this. For example, a plurality of diode-coupled transistors may be coupled in parallel to form the transistors PNP1, PNP2, In this case, for example, the number of transistors in a transistor group forming the transistor PNP2 may be made smaller than the number of transistors in a transistor group forming the transistor PNP1. Further, the areas of the emitters as the whole transistors of the transistors PNP1, PNP2 may be made the same. This configuration may be similarly installed, particularly, in later-illustrated FIG. 18.

The differential amplifier receives the output voltage into the noninverting input terminal via the resistance R2, and receives the output voltage into the inverting input terminal via the resistance R3. The potential difference between them is amplified and output from the output terminal.

The output transistor MP7 is, for example, a p-type MOSFET. The output transistor MP7 has, for example, a gate into which the output of the differential amplifier is applied, a source coupled to the power supply voltage, and a drain coupled to the differential amplifier via the resistances R2, R3.

The operations and functions of the circuitry elements are the same as those in the general BGR. On the other hand, the reference voltage circuitry 10 according to this embodiment has the two output terminals which outputs the first voltage VT1 and the second voltage VT2, respectively.

The first voltage VT1 is a voltage low in temperature inclination as in the general BGR. On the other hand, the second voltage VT2 is the same voltage as but different in temperature characteristic from the first voltage VT1, namely, the same voltage at a certain temperature, but becomes a different voltage when sifting from the temperature. As explained above, the reference voltage circuitry 10 outputs the first voltage VT1 having the first temperature characteristic and the second voltage VT2 having the second temperature characteristic different from the first temperature characteristic.

Incidentally, the first voltage VT1 has the temperature inclination caused from the power supply voltage, a current source or the like even if the resistances R1, R2 and the like are set to theoretically correct values. A collector current Ic of the transistors PNP1, PNP2 is expressed as follows using a base-emitter voltage VBE, a thermal voltage Vt, a VBE voltage VB0 at an absolute zero, a saturation current Is, an absolute temperature T, and a constant A. k represents a Boltzmann constant ($1.38 \times 10^{-23}$), and q represents a unit charge ($1.60 \times 10^{-19}$).

$$Ic = Is\exp\left(\frac{VBE}{Vt}\right), \quad \text{(eq. 1)}$$
$$\text{where } Vt = \frac{kT}{q}, \quad Is = AT^\gamma \exp\left(-\frac{VB0}{Vt}\right)$$

The temperature characteristic of VBE when driving the transistor by a current source IE1 having the temperature characteristic can be expressed as follows where IE=$BT^m$ (B: constant).

$$VBE = Vt\ln\left(\frac{IE1}{Is}\right) = VB0 + Vt\left[\ln\frac{B}{A} - (\gamma - m)\ln T\right] \quad \text{(eq. 2)}$$

Here, Vt is proportional to T, and approximately $\gamma=3.2$, $m=1$ in the case of silicon, so that $(\gamma-m)\ln T$ is approximately proportional to T in a zone of T=233 to 398 K, so that VBE in (eq. 2) comes to have a characteristic having a curvature approximate to $-T^2$. In other words, the first voltage VT1 has a curvature approximate to $T^2$.

According to the reference voltage circuitry 10 according to this embodiment, the second voltage VT2 further has a temperature characteristic based on $T^2$ with respect to the first temperature characteristic of the first voltage VT1.

Figure 3:
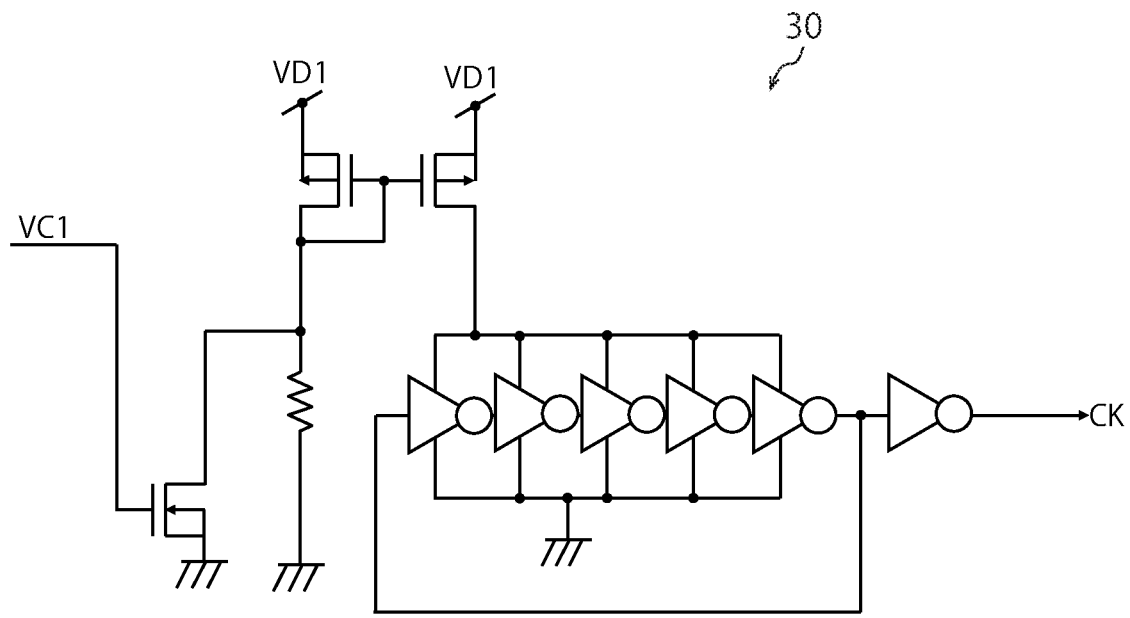
FIG. 3 is a circuitry diagram illustrating an example of an oscillation circuitry according to an embodiment.

FIG. 3 is a circuitry diagram illustrating an example of the oscillation circuitry 30 according to this embodiment. The oscillation circuitry 30 includes an n-type MOSFET, a current mirror, and a ring oscillator having an odd number of NOT circuitries coupled in series and in a ring shape. An input signal is applied to the n-type MOSFET, to make a drain current flow through the current mirror. A voltage based on the output current from the current mirror is applied as power supply to each of the NOT circuitries. A NOT circuitry on the output side is used as a buffer, and does not have to be provided as long as an ideal signal can be acquired immediately before the buffer.

The plurality of NOT circuitries coupled in series each inverts input and output while having a delay based on the voltage applied as a power supply. Therefore, the frequency is controlled by the magnitude of the input voltage, and a clock signal having a desired frequency is output from the oscillation circuitry 30. Here, when the fourth voltage VC1 increases, the drain current of the n-type MOSFET in which the fourth voltage VC1 is applied to the gate increases. The drain current is added to the current of a resistance element coupled to the n-type MOSFET in parallel, and the increase in the drain current also increases the output current from the current mirror. In this case, the power supply voltage of the NOT circuitries constituting the ring oscillator also increases to decrease the propagation delay of each NOT circuitry, so that the frequency of the clock signal CK to be output increases. Conversely, when the fourth voltage VC1 decreases, the drain current of the n-type MOSFET in which the fourth voltage VC1 is applied to the gate decreases, and the output current from the current mirror also decreases. Thus, the power supply voltage of the NOT circuitries constituting the ring oscillator decreases to increase the propagation delay of each NOT circuitry, so that the frequency of the clock signal CK to be output decreases.

Figure 4:
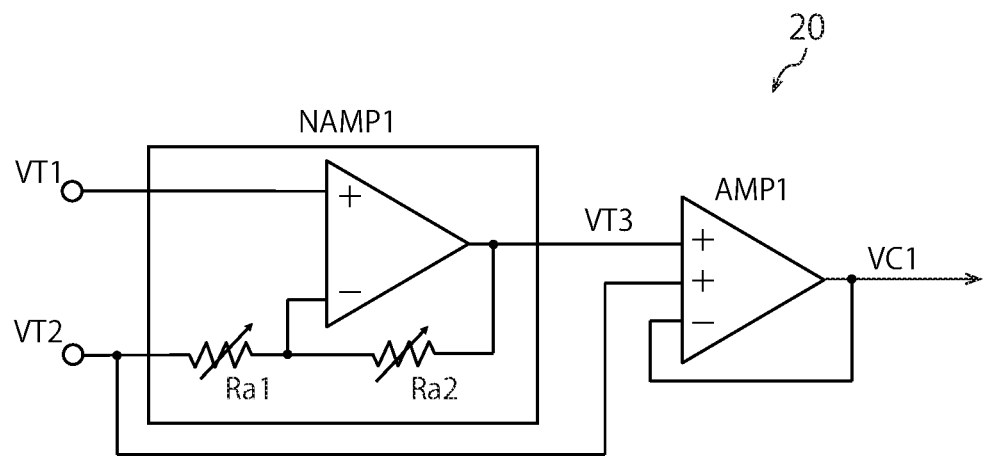
FIG. 4 is a circuitry diagram illustrating an example of a correction circuitry according to an embodiment.

FIG. 4 is a circuitry diagram illustrating an example of the correction circuitry 20 according to this embodiment. The correction circuitry 20 includes a first amplifier NAMP1 and a second amplifier AMP1. The correction circuitry 20 receives the first voltage VT1 and the second voltage VT2 which are output from the reference voltage circuitry 10, and outputs the fourth voltage VC1.

The first amplifier NAMP1 includes an amplifier, a first resistance Ra1, and a second resistance Ra2. The first amplifier NAMP1 is an inverting amplifier which performs negative feedback to the amplifier by the first resistance Ra1 and the second resistance Ra2. The gain of the first amplifier NAMP1 is decided by Ra1, Ra2. The first amplifier NAMP1 has a noninverting input terminal to which the first voltage VT1 is applied and an inverting input terminal to which the second voltage VT2 is applied, and outputs a third voltage VT3 which has a third temperature characteristic different from both of the first temperature characteristic and the second temperature characteristic.

The second amplifier AMP1 is an amplifier which has noninverting input terminals to which the second voltage VT2 and the third voltage VT3 are coupled respectively, and an inverting input terminal to which the fourth voltage VC1 to be output is coupled, namely, negatively fed back.

Figure 5:
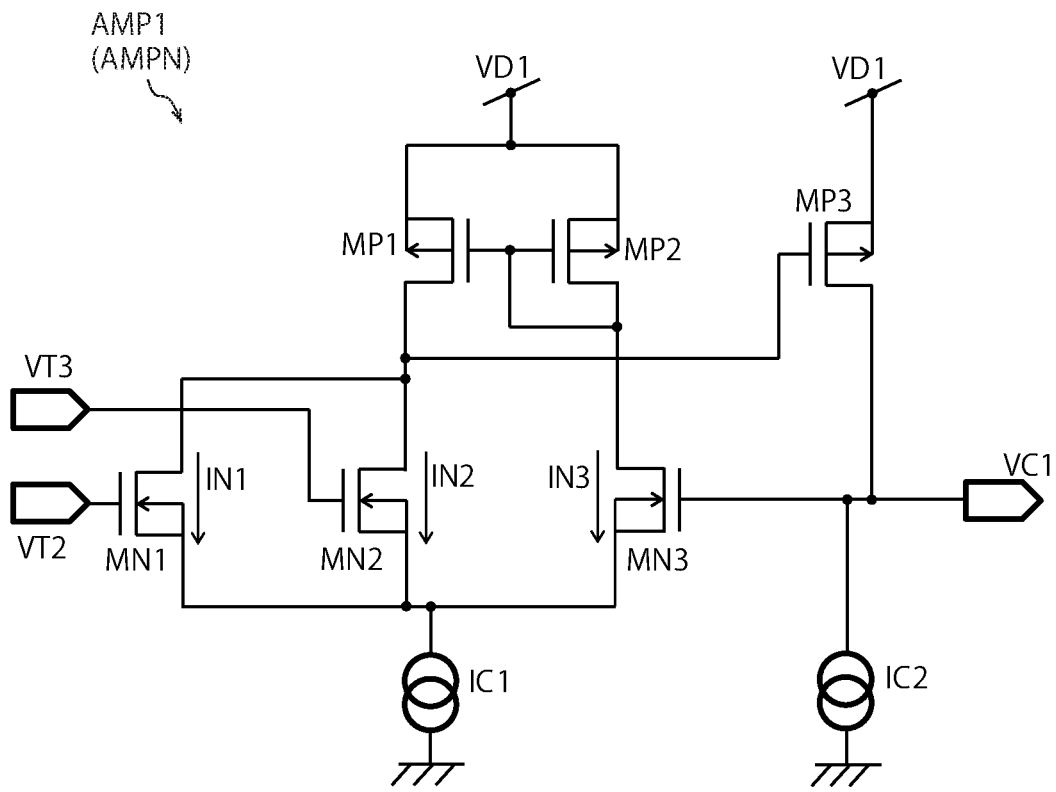
FIG. 5 is a circuitry diagram illustrating an example of a second amplifier according to an embodiment.

FIG. 5 is a circuitry diagram illustrating an example of the second amplifier AMP1. The second amplifier AMP1 includes transistors MN1, MN2 which accept noninverting inputs, a transistor MN3 which accepts an inverting input, transistors MP1, MP2 which constitute a current mirror, and an output transistor MP3.

The transistors MN1, MN2 are n-type MOSFETs having gates to which the second voltage VT2 and the third voltage VT3 are applied, respectively. The transistors MN1, MN2 have drains and sources coupled in common. The transistor MN3 is an n-type MOSFET having a gate to which the fourth voltage VC1 being a feedback voltage is applied. The transistor MN3 has a source coupled in common to those of the transistors MN1, MN2. The sources coupled in common of the transistors MN1, MN2, MN3 are coupled to a current source IC1.

The transistor MP1 is a p-type MOSFET having a source coupled to a power supply voltage VD1, a gate coupled to a gate of the transistor MP2, and a drain coupled to the drains of the transistors MN1, MN2. The transistor MP2 is a p-type MOSFET having a source coupled to the power supply voltage VD1, the gate coupled to the drain thereof and to the gate of the transistor MP1, and the drain coupled to the drain of the transistor MN3.

By coupling the gate of the transistor MP1 and the gate and the drain of the transistor MP2, the transistors MP1, MP2 constitute a current mirror which outputs the drain current of the transistor MP2 as the drain current of the transistor MP1.

The output transistor MP3 is a p-type transistor having a source coupled to the power supply voltage VD1, a gate coupled to the drains of the transistors MN1, MN2, and a drain coupled to the output terminal and to the gate of the transistor MN3. The drain is coupled also to a current source IC2. By coupling the gate of the transistor MN3 and the drain of the output transistor MP3, the fourth voltage VC1 to be output is applied to the gate of the transistor MN3.

As explained above, the second amplifier AMP1 operates as an amplifier for negative feedback having the noninverting input terminals to which the second voltage VT2 and the third voltage VT3 are applied, and outputting the fourth voltage VC1.

Here, drain currents IN1, IN2 of the transistors MN1, MN2 can be expressed as follows using a channel width W and a channel length L. $\mu$ represents the mobility of a carrier, and $C_{ox}$ represents a gate capacitance per unit area.

$$M = \frac{1}{2}\mu C_{ox}\frac{W}{L} \quad \text{(eq. 3)}$$

$$IN1 = M(V_{gs} + a - V_{th})^2, \quad \text{(eq. 4)}$$
$$IN2 = M(V_{gs} - a - V_{th})^2$$

a represents an offset from Vgs and is set to, for example, a=n(T−25) (n: constant).

Further, when an offset from Vgs of the transistor MN3 is b, a drain current IN3 can be expressed as follows.

$$IN3 = M(V_{gs} + b - V_{th})^2 \quad \text{(eq. 5)}$$

With the amplifier for negative feedback as in FIG. 5, an output voltage VOUT becomes stable at IN3=(IN1+IN2)/2. Based on (eq. 4), (eq. 5), this condition can be expressed as follows.

$$(V_{gs} + b - V_{th})^2 = [(V_{gs} - V_{th})^2 + a^2] \quad \text{(eq. 6)}$$

This is solved about b, the solution can be found as follows. However, a condition where a gate-source voltage of the transistor IN3 is higher than a threshold voltage is used.

$$b = -(V_{gs} - V_{th}) + (V_{gs} - V_{th})\sqrt{1 + \frac{a^2}{V_{gs} - V_{th}}} \quad \text{(eq. 7)}$$

When performing approximation with a<<1, b is found as follows.

$$b = \frac{a^2}{2(V_{gs} - V_{th})} = \frac{n^2(T - 25)^2}{2(V_{gs} - V_{th})} \quad \text{(eq. 8)}$$

Figure 6:
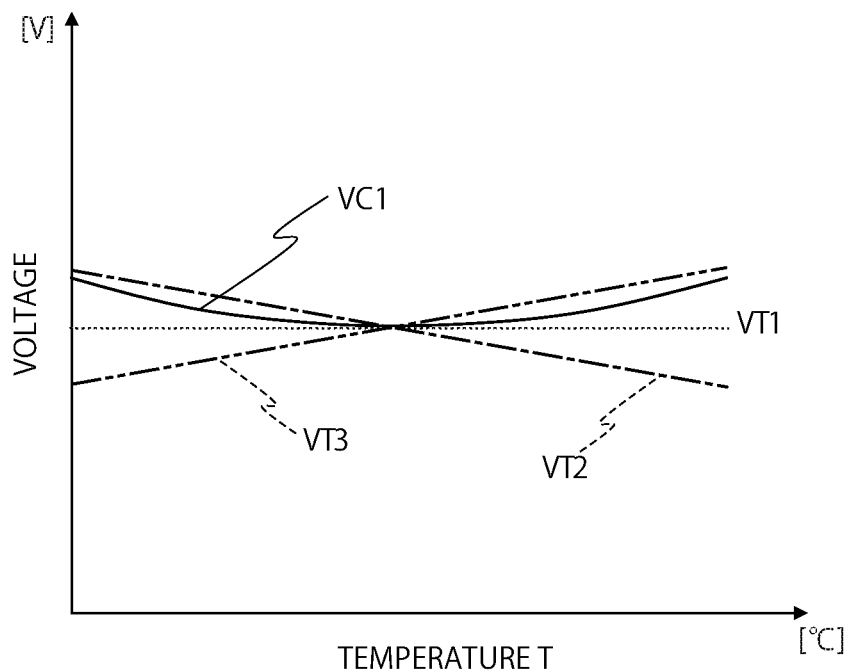
FIG. 6 is a graph indicating temperature characteristics of voltages according to an embodiment.

From (eq. 8), in the case of a<<1, b is expressed by a function of $T^2$. FIG. 6 is a graph indicating the temperature characteristics of the second voltage VT2, the third voltage VT3, and the fourth voltage VC1 with the temperature characteristic of the first voltage VT1 as a reference. A solid line indicates the fourth voltage VC1, a broken line indicates the first voltage VT1, a one-dot chain line indicates the second voltage VT2, and a two-dot chain line indicates the third voltage VT3.

As illustrated in FIG. 6, for example, assuming that the second voltage VT2 has a negative gradient with the first voltage VT1 as a reference, the third voltage VT3 becomes a voltage having a positive gradient close to that of the second voltage VT2 by the first amplifier NAMP1. Further, by inputting the voltages to the second amplifier AMP1, the fourth voltage VC1 becomes a voltage having the fourth temperature characteristic having a temperature characteristic proportional to a square of the temperature with respect to the first voltage VT1.

As explained above, according to this embodiment, the fourth voltage VC1 output by the first amplifier NAMP1 and the second amplifier AMP1 has a secondary temperature characteristic with respect to the first voltage VT1. Therefore, even when the temperature characteristic proportional to a square of the temperature occurs in the first voltage VT1, the fourth voltage VC1 canceling the secondary temperature characteristic of the first voltage VT1 can be output. As explained above, it becomes possible to output the fourth voltage VC1 canceling the secondary temperature characteristic of the first voltage VT1 to suppress the secondary temperature characteristic of the voltage to be applied to the oscillation circuitry 30. As a result of this, the oscillation apparatus 1 can output the clock signal having a stable frequency irrespective of the secondary temperature characteristic occurring in the reference voltage circuitry 10. Further, by setting the temperature characteristic of the resistance to an appropriate one, it becomes possible to make the output voltage into the one having the above-explained temperature characteristic.

Figure 7:
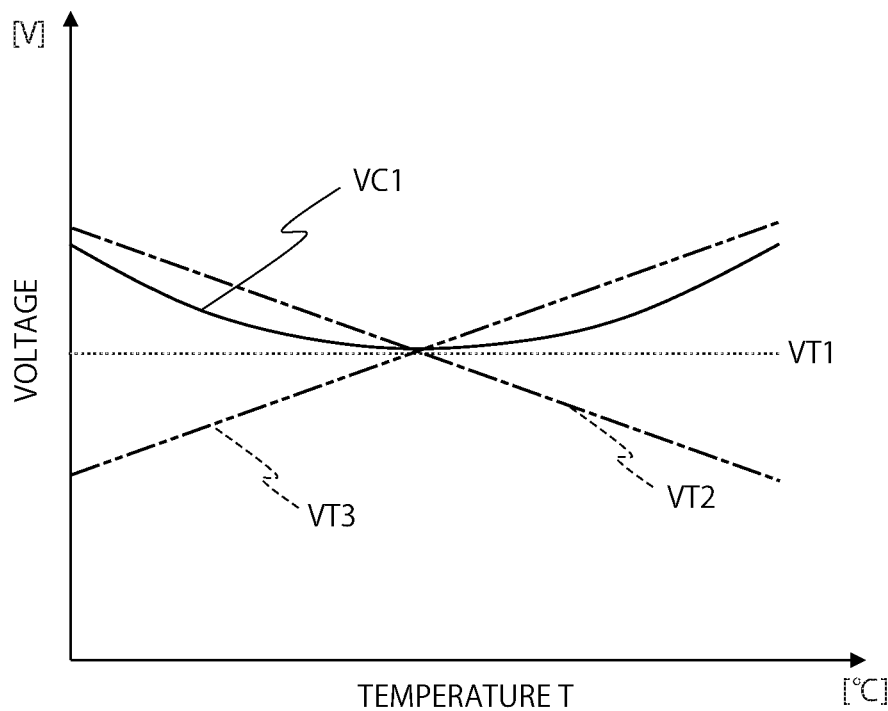
FIG. 7 is a graph indicating temperature characteristics of voltages according to an embodiment.
Figure 8:
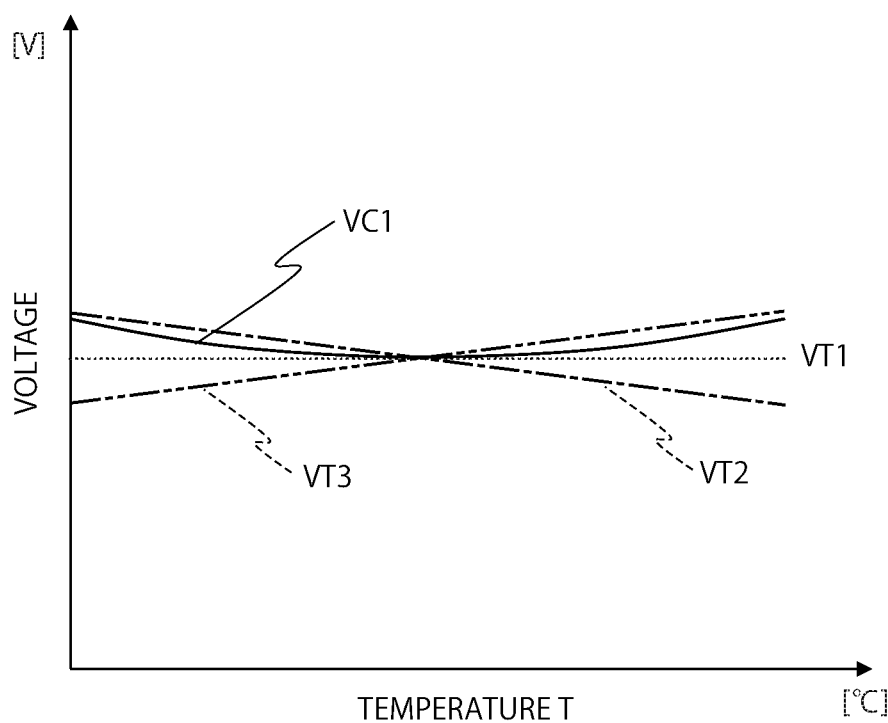
FIG. 8 is a graph indicating temperature characteristics of voltages according to an embodiment.

FIG. 7 is a graph increased in the gain of the first amplifier NAMP1 as compared with the case illustrated in FIG. 6. On the other hand, FIG. 8 is a graph decreased in the gain of the first amplifier NAMP1 as compared with the case illustrated in FIG. 6. As illustrated, by adjusting the secondary temperature characteristic by the gain of the first amplifier NAMP1, it becomes possible to apply the embodiments to the reference voltage circuitry 10 in various cases.

Figure 9:
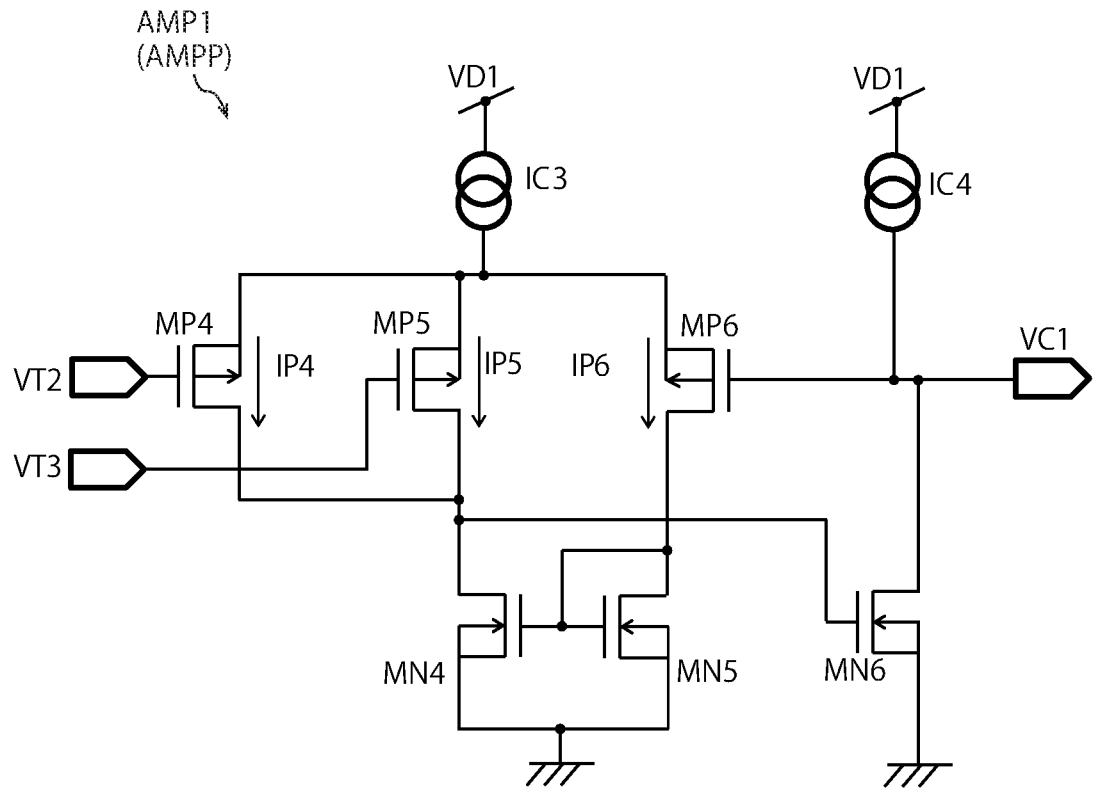
FIG. 9 is a circuitry diagram illustrating an example of a second amplifier according to an embodiment.

FIG. 9 is a circuitry diagram illustrating another example of the second amplifier AMP1. The second amplifier AMP1 includes transistors MP4, MP5 which accept noninverting inputs, a transistor MP6 which accepts an inverting input, transistors MN4, MN5 which constitute a current mirror, and an output transistor MP6.

The transistors MP4, MP5 are p-type MOSFETs having gates to which the second voltage VT2 and the third voltage VT3 are applied, respectively. The transistors MP4, MP5 have drains and sources coupled in common. The transistor MP6 is a p-type MOSFET having a gate to which the fourth voltage VC1 being a feedback voltage is applied. The transistor MP6 has a source coupled in common to those of the transistors MP4, MP5. The sources coupled in common of the transistors MP4, MP5, MP6 are coupled to the power supply voltage VD1 via a current source IC3.

The transistor MN4 is an n-type MOSFET having a source grounded, a gate coupled to a gate of the transistor MN5, and a drain coupled to the drains of the transistors MP4, MP5, The transistor MN5 is an n-type MOSFET having a source grounded, the gate coupled to the drain thereof and to the gate of the transistor MN4, and the drain coupled to the drain of the transistor MP6.

By coupling the gate of the transistor MN4 and the gate and the drain of the transistor MN5, the transistors MN4, MN5 constitute a current mirror which outputs the drain current of the transistor MN5 as the drain current of the transistor MN4.

The output transistor MN6 is an n-type transistor having a source grounded, a gate coupled to the drains of the transistors MP4, MP5, and a drain coupled to the output terminal and to the gate of the transistor MP6. The drain is further coupled to the power supply voltage VD1 via a current source IC4. By coupling the gate of the transistor MP6 and the drain of the output transistor MN6, the fourth voltage VC1 to be output is applied to the gate of the transistor MP6.

As explained above, the second amplifier AMP1 operates as an amplifier for negative feedback having the noninverting input terminals to which the second voltage VT2 and the third voltage VT3 are applied, and outputting the fourth voltage VC1.

Figure 10:
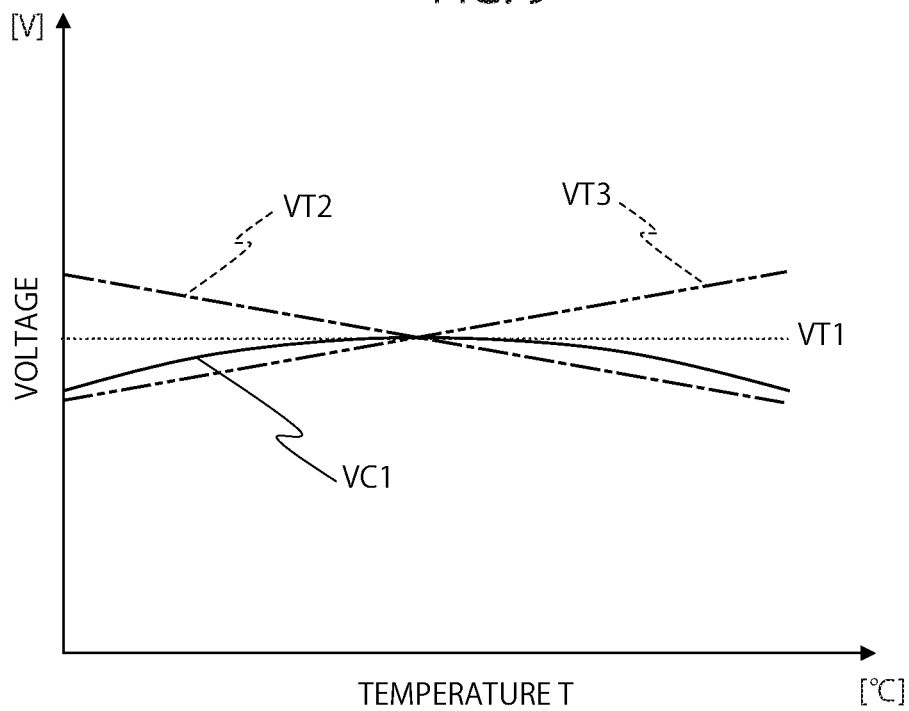
FIG. 10 is a graph indicating temperature characteristics of voltages according to an embodiment.

FIG. 10 is a graph indicating a relationship between each voltage and temperature in the case of using the second amplifier AMP1 in FIG. 9. The fourth voltage VC1 in the graph of FIG. 6 has a downward protruding shape, whereas the fourth voltage VC1 has an upward protruding shape in FIG. 10. As explained above, the fourth voltage VC1 can have a secondary temperature characteristic reverse in positive/negative with respect to the first voltage VT1. Therefore, when the first voltage VT1 has a secondary temperature characteristic having a downward protruding shape, it becomes possible to cancel the secondary temperature characteristic by using the second amplifier AMP1 as illustrated in FIG. 9. As a matter of course, also in this case, the shape of the fourth voltage VC1 can be deformed as in FIG. 7, FIG. 8 with respect to FIG. 6 by adjusting the gain of the first amplifier NAMP1.

Second Embodiment

The above embodiment includes either the circuitry which outputs the signal having the secondary characteristic protruding downward or the circuitry which outputs the signal having the secondary characteristic protruding upward as the second amplifier AMP1, This embodiment includes an amplifier capable of coping with both of the cases.

Figure 11:
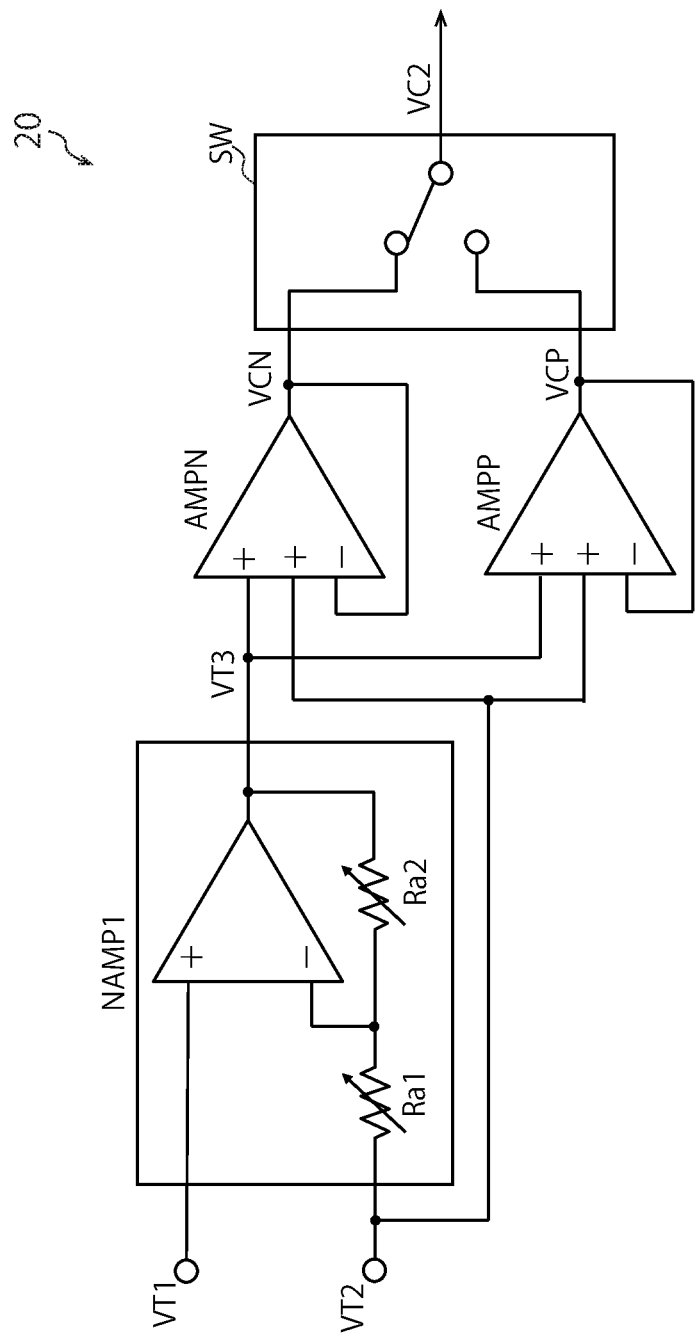
FIG. 11 is a circuitry diagram illustrating an example of a correction circuitry according to an embodiment.

FIG. 11 is a circuitry diagram illustrating an example of a correction circuitry 20 according to this embodiment. The correction circuitry 20 includes a first amplifier NAMP1, a second amplifier AMPN, a third amplifier AMPP, and a switch Sw.

The second amplifier AMPN is equivalent to the second amplifier illustrated in FIG. 5, and the third amplifier AMPP is equivalent to the second amplifier illustrated in FIG. 9. More specifically, the second amplifier AMPN is an amplifier which outputs, when the second voltage VT2 and the third voltage VT3 are applied to noninverting input terminals, a fourth voltage VCN having a downward protruding temperature characteristic, and feeds back the fourth voltage VCN to an inverting input terminal. The third amplifier AMPP is an amplifier which outputs, when the second voltage VT2 and the third voltage VT3 are applied to noninverting input terminals, a fifth voltage VCP having an upward protruding temperature characteristic, and feeds back the fifth voltage VCP to an inverting input terminal.

The switch Sw is coupled to an output of the second amplifier AMPN and to an output of the third amplifier AMPP, and outputs a voltage output from one of the amplifiers. In other words, the switch Sw selects either the fourth voltage VCN or the fifth voltage VCP, and outputs the selected voltage to the oscillation circuitry 30.

As explained above, according to this embodiment, irrespective of the voltage having the downward protruding characteristic or the voltage having the upward protruding characteristic, the correction circuitry 20 selects, in any case, the amplifier which performs an output having an inverse secondary characteristic and thereby can control the frequency characteristic of the oscillation circuitry 30. For example, in the case of coupling the reference voltage circuitry 10 and the oscillation circuitry 30 and making them to oscillate, the secondary temperature characteristic is measured, and the switch Sw selects an amplifier which performs an output in the correction circuitry 20 based on the measured result, thus enabling a control to output a clock signal having a frequency characteristic stable in various cases.

Third Embodiment

Figure 12:
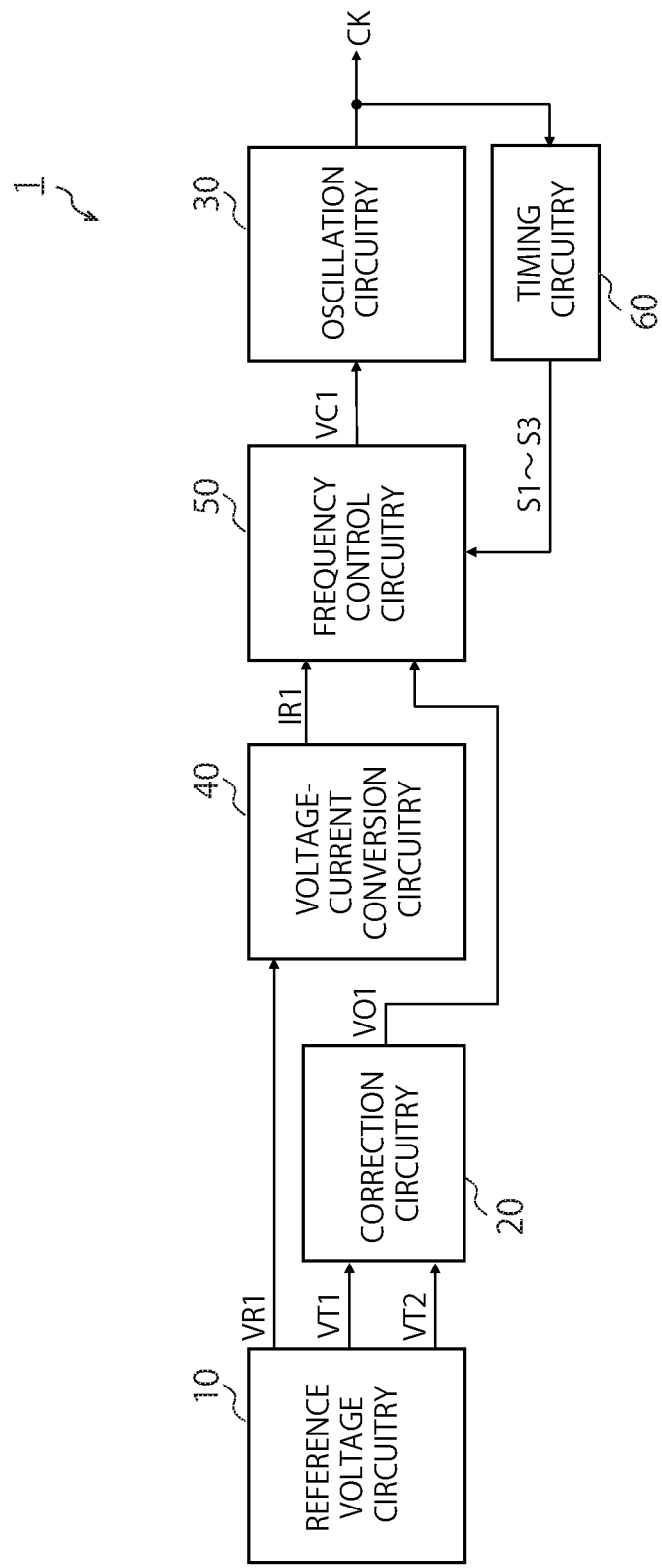
FIG. 12 is a block diagram schematically illustrating an oscillation apparatus according to an embodiment.

FIG. 12 is a block diagram schematically illustrating an oscillation apparatus 1 according to a third embodiment. The oscillation apparatus 1 includes a reference voltage circuitry 10, a correction circuitry 20, and an oscillation circuitry 30 which have the same configurations as those in the above embodiment, and further includes a voltage-current conversion circuitry 40, a frequency control circuitry 50, and a timing circuitry 60. The reference voltage circuitry 10 outputs the first voltage VT1 and the second voltage VT2, and also a reference voltage VR1.

Figure 13:
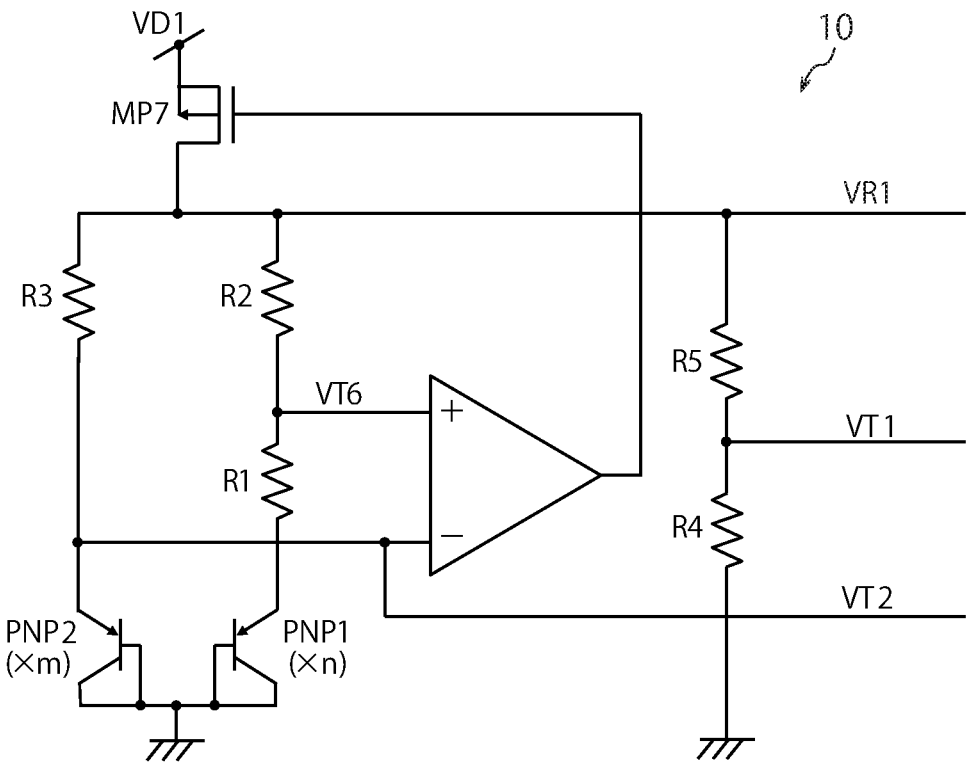
FIG. 13 is a circuitry diagram illustrating an example of a reference voltage circuitry according to an embodiment.

FIG. 13 is a diagram illustrating an example of the reference voltage circuitry according to this embodiment. The reference voltage circuitry 10 is basically the same as the reference voltage circuitry illustrated in FIG. 2, but outputs the first voltage VT1 and the second voltage VT2 and additionally outputs the reference voltage VR1. The reference voltage VR1 outputs a potential of a drain of an output transistor MP7 and is grounded via resistances R5, R4. The first voltage VT1 is output from a node between the resistances R4 and R5. The second voltage VT2 is output to have a temperature characteristic different from that of the first voltage VT1 as in the above-explained embodiment.

Figure 14:
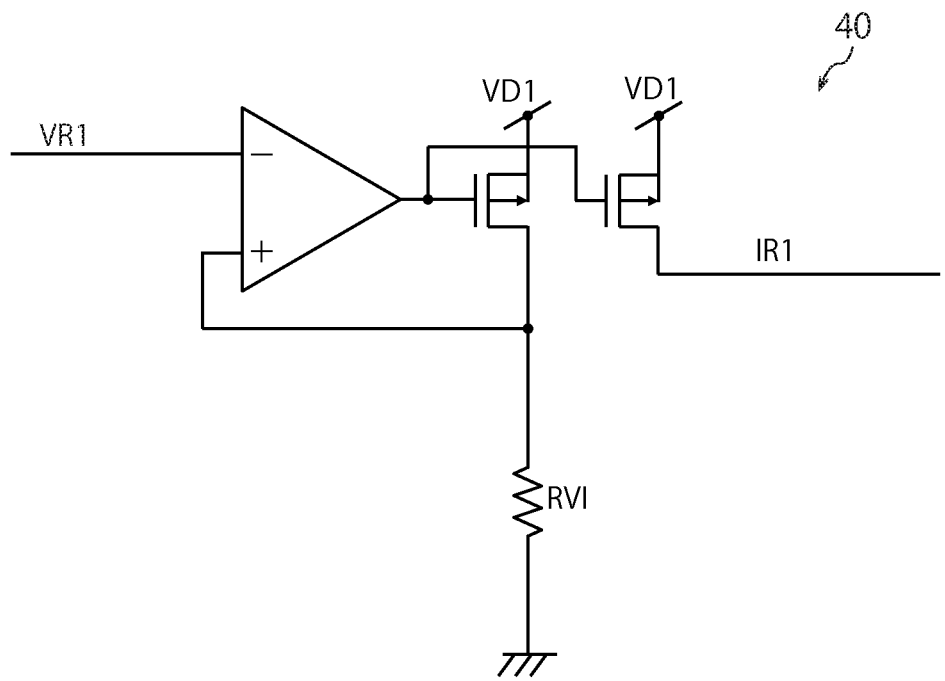
FIG. 14 is a circuitry diagram illustrating an example of a voltage-current conversion circuitry according to an embodiment.

FIG. 14 is a diagram illustrating an example of a voltage-current conversion circuitry according to this embodiment. A voltage-current conversion circuitry 40 includes an amplifier, a resistance RVI, an output transistor, and a monitor transistor.

Each of the output transistor and the monitor transistor is a p-type MOSFET. These transistors have sources coupled to the power supply voltage VD1 and gates coupled in common. The gates coupled in common are coupled to an output of the amplifier. The output transistor outputs a voltage based on the output of the amplifier. The monitor transistor has a drain grounded via the resistance RVI, and a voltage from the drain is coupled to a noninverting input terminal of the amplifier.

The amplifier has an inverting input terminal to which the reference voltage VR1 is coupled, and a noninverting input terminal to which the drain of the monitor transistor is coupled The drain current of the monitor transistor is a current proportional to the drain current of the output transistor. When the current is grounded via the resistance RVI, a voltage based on the drain current and on the resistance RVI is input to the noninverting input terminal. In other words, the output of the amplifier becomes stable in a state proportional to a product of a current IR1 to be output and the resistance RVI.

In other words, the current IR1 output from the voltage-current conversion circuitry 40 becomes a current (reference current) proportional to VR1/RVI, namely, proportional to the reference voltage. The current IR1 output from the voltage-current conversion circuitry 40 is input into the frequency control circuitry 50.

Figure 15:
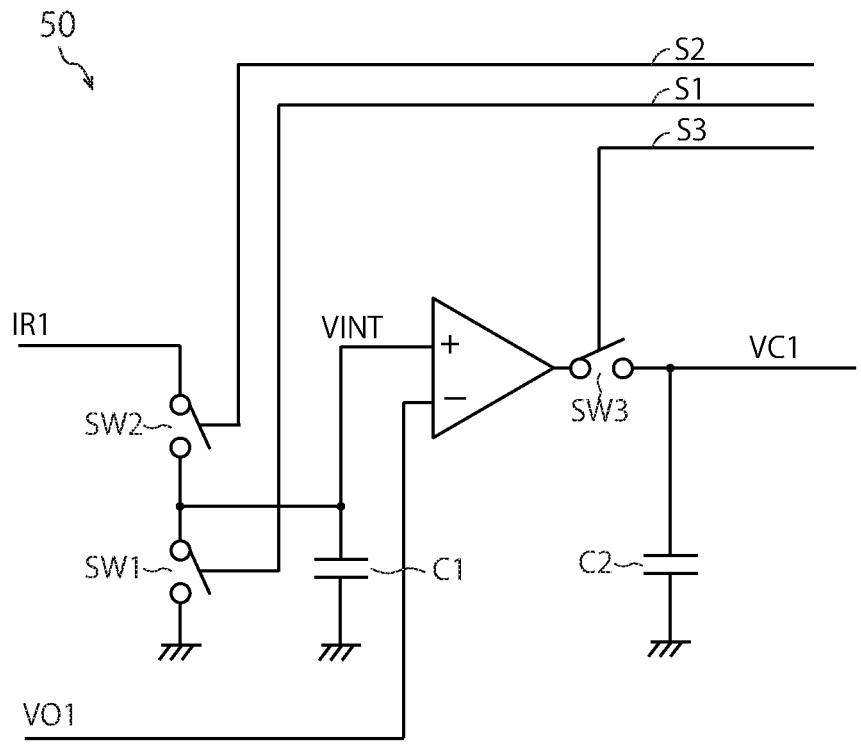
FIG. 15 is a circuitry diagram illustrating an example of a frequency control circuitry according to an embodiment.

FIG. 15 is a circuitry diagram illustrating an example of the frequency control circuitry according to this embodiment. The frequency control circuitry 50 receives a fourth voltage VO1 output from the correction circuitry 20, the current IR1 output from the voltage-current conversion circuitry 40, and a frequency fed back from the oscillation circuitry 30 via the timing circuitry 60, and outputs the voltage VC1 to be applied to the oscillation circuitry 30.

The frequency control circuitry 50 includes switches Sw1, Sw2, Sw3, capacitors C1, C2, and an amplifier.

The switches Sw1, Sw2, Sw3 switch between ON and OFF responding to signals S1, S2, S3 output from the timing circuitry 60, The input current IR1 is grounded via the switches Sw2, Sw1. A node between the switches Sw2 and Sw1 is coupled to the noninverting input terminal of the amplifier and grounded via the capacitor C1.

When the switch Sw1 is turned ON, the voltage accumulated in the capacitor C1 is discharged. On the other hand, when the switch Sw1 is turned OFF and the switch Sw2 is turned ON, the capacitor C1 charges, and a voltage is applied to the noninverting input terminal of the amplifier.

The amplifier further has an inverting input terminal coupled to the voltage Vol output from the correction circuitry 20. The amplifier amplitudes a difference between the voltage charged after discharge by the signals S1, S2 and the voltage VO1, and outputs the amplitude voltage.

Figure 16:
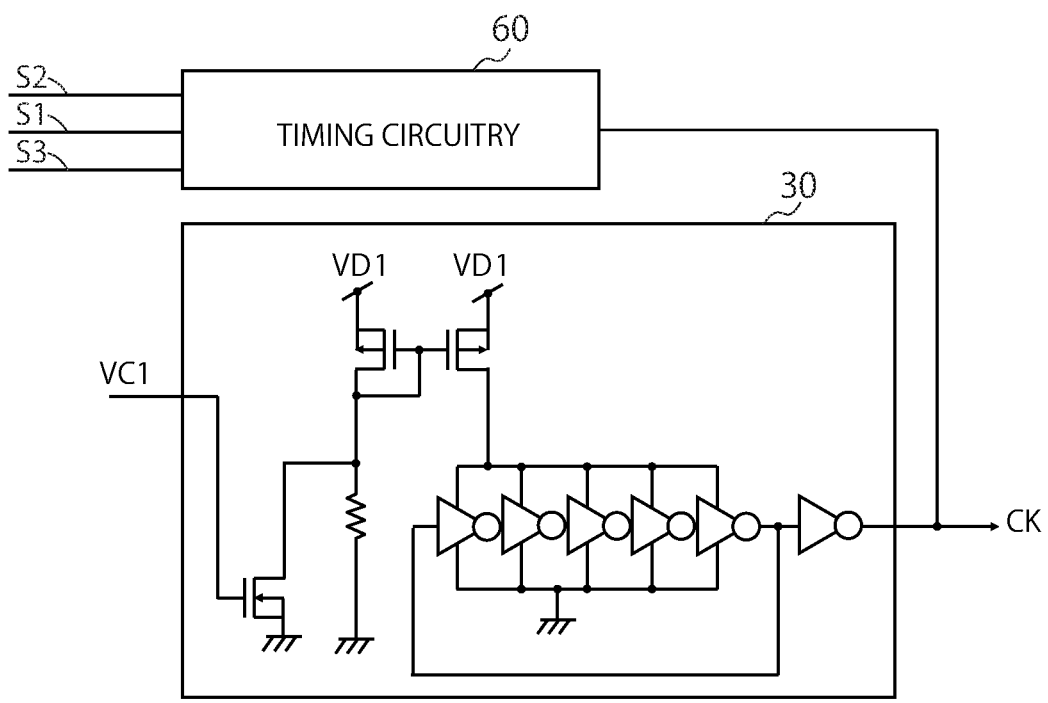
FIG. 16 is a diagram illustrating coupling between an oscillation circuitry and a timing circuitry according to an embodiment.

The switch Sw3 is coupled to the output of the amplifier, and outputs the output voltage VC1 to the oscillation circuitry 30. The switch Sw3 is grounded on the output side of the frequency control circuitry 50 via the capacitor C2 in parallel with the output terminal, FIG. 16 is a diagram illustrating coupling between the oscillation circuitry 30 and the timing circuitry 60 according to this embodiment. The oscillation circuitry 30 is the same as in each of the above embodiments. The clock signal output from the oscillation circuitry 30 is output from the oscillation apparatus 1 and input into the timing circuitry 60.

The timing circuitry 60 outputs the signals S1, S2, S3 based on the input clock signal.

Figure 17:
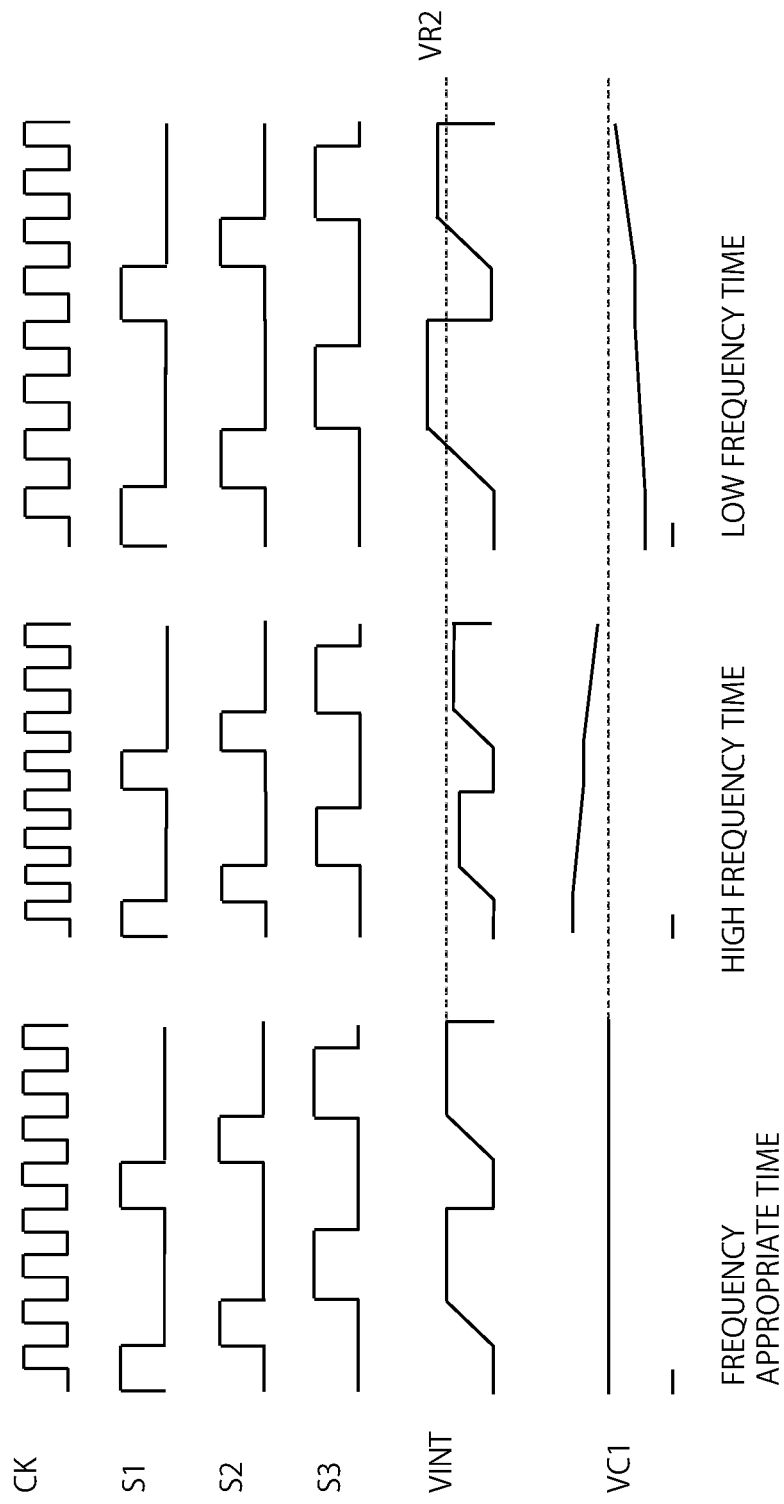
FIG. 17 is a chart illustrating changes in voltages in a frequency control circuitry according to an embodiment.

FIG. 17 is a chart illustrating changes in the signal output from the timing circuitry 60 and in the voltages in the frequency control circuitry 50. The uppermost one indicates the clock signal output from the oscillation circuitry 30, the second one indicates the voltage of the signal S1, the third one indicates the voltage of the signal S2, the fourth one indicates the voltage of the signal S3, the fifth one indicates a voltage VINT between the switches Sw1 and Sw2, and the lowermost one indicates the output voltage VC1. Further, in order from the left, the changes in voltages in the case where the frequency is appropriate, the case where the frequency is high, and the case where the frequency is low, are illustrated.

As illustrated in FIG. 17, the timing circuitry 60 outputs a signal for one cycle as the signal S1 every four cycles with respect to the clock frequency. The timing circuitry 60 further outputs the same signal as the signal S2 in a manner to delay by one cycle from the signal S1. The timing circuitry 60 further outputs a signal for 1.5 cycles as the signal S3 in a manner to delay by one cycle from the signal S2.

The switches Sw1, Sw2, Sw3 of the frequency control circuitry 50 repeat ON/OFF based on the signals S1, S2, S3.

First of all, when the switch Sw1 is turned ON based on the signal S1, the capacitor C1 discharges.

At the timing when one cycle has elapsed, the switch Sw1 is turned OFF and the switch Sw2 is turned ON based on the signals S1, S2 to charge the capacitor C1. This charge increases the voltage VINT. When the clock signal of an appropriate frequency is fed back, the voltage is increased by the capacitor C1, for example, up to the reference voltage VR2.

At the timing when one more cycle has elapsed, the switch Sw2 is turned OFF and the switch Sw3 is turned ON based on the signals S2, S3 to output the voltage based on the output from the amplifier as VC1. Since an integration circuitry is formed by the capacitor C2, a voltage for one cycle of the output from the amplifier, namely, for 1.5 cycles of the clock signal is output as the integrated voltage VC1.

When the voltage VC1 becomes high and the frequency of the clock signal output from the oscillation circuitry 30 becomes high, the ON/OFF timings of the switches Sw1, Sw2, Sw3 accordingly become faster.

Since the ON period of the switch Sw2 becomes shorter, the voltage VINT merely reaches a value lower than that in the case of an appropriate frequency. Therefore, the voltage VINT integrated via the amplifier and the switch Sw3 becomes a lower value than the reference voltage VR2 as illustrated in the drawing. Then, when the output voltage is high, control is performed so that the output voltage VC1 gradually becomes lower. As a result of this, the voltage to be applied to the oscillation circuitry 30 becomes low to control the frequency to be low, namely, to approach an appropriate frequency.

Conversely, when the voltage VC1 becomes low and the frequency of the clock signal output from the oscillation circuitry 30 becomes low, the ON/OFF timings of the switches Sw1, Sw2, Sw3 accordingly become slower. The ON period of the switch Sw2 also becomes longer. Therefore, the voltage VINT is raised to be higher than the reference voltage VR2 when the voltage VINT is appropriate conversely to the above, and control is performed so that the output voltage VC1 becomes higher. As a result of this, the voltage to be applied to the oscillation circuitry 30 becomes high to control the frequency to be high, namely, to approach an appropriate frequency.

As explained above, according to this embodiment, it becomes possible to stabilize the frequency of the output clock signal with respect to the secondary temperature characteristic, and to control an increase/decrease in the frequency of the clock signal accompanying the fluctuation in voltage by feedback so that a signal of a stable frequency is output. Note that the cycles and so on of the above signals S1, S2, S3 are not limited to those in the example illustrated in FIG. 17, but the signals may be signals capable of controlling the voltage by appropriately feeding back the frequency even though the cycles and so on are different from those illustrated in FIG. 17.

Fourth Embodiment

Figure 18:
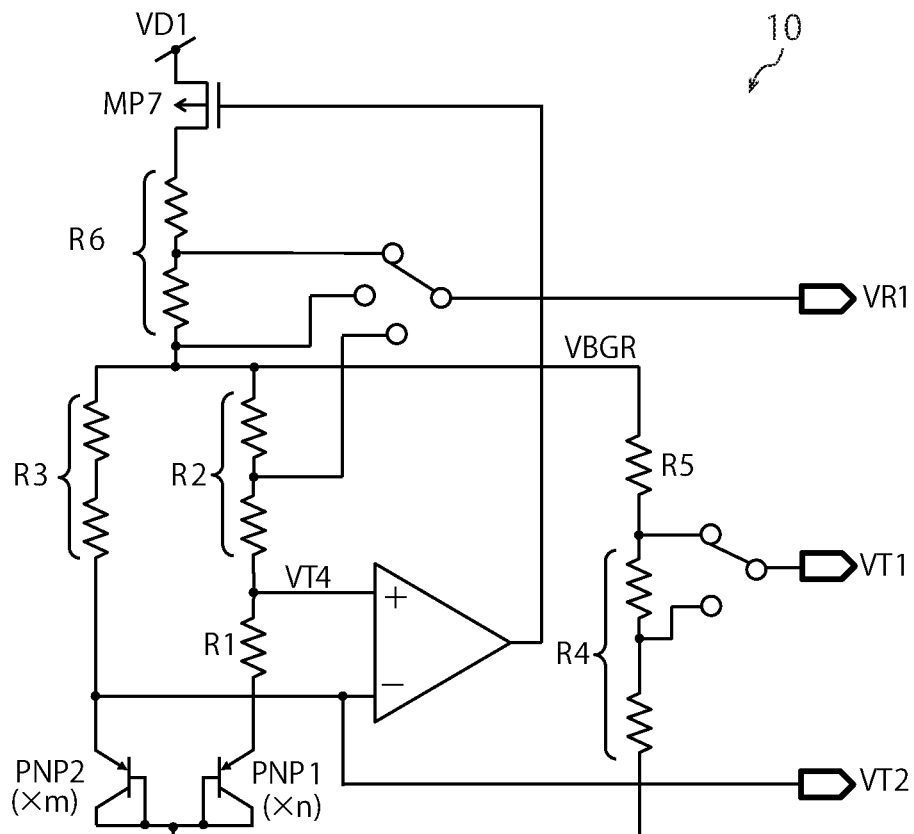
FIG. 18 is a circuitry diagram illustrating an example of a reference voltage circuitry according to an embodiment.

FIG. 18 is a circuitry diagram illustrating an example of a reference voltage circuitry 10 in an oscillation apparatus 1 according to a fourth embodiment. The reference voltage circuitry 10 is made by dividing the resistances of the reference voltage circuitry illustrated in FIG. 13 and adding two more switches. The reference voltage circuitry 10 is the one replacing, for example, the reference voltage circuitry illustrated in FIG. 12.

The reference voltage VR1 is controlled by the switch which can output it via the resistance R6 or further via a part of the resistance R2 to the drain of the output transistor MP7. More specifically, the reference voltage VR1 is output by selecting one of a voltage made by voltage-lowering by a part of the resistance R6, a voltage made by voltage-lowering by the resistance R6, and a voltage made by voltage-lowering by the resistance R6 and a part of resistance R2, from the drain voltage of the output transistor MP7. Similarly, the first voltage VT1 is also controlled by a switch so as to be switched from a voltage made by voltage-lowering by a part of the resistance R4.

They may be installed by constituting, for example, each of the resistances R2, R4, R6 using a plurality of resistances as a resistance group composed of a plurality of resistances, Wiring enabling output may be provided at a predetermined portion or an arbitrary portion in each of the resistance groups, and a switch for selecting the wiring may be provided in each of the resistance groups. Further, all of the resistances R2, R4, R6 do not always need to be made into resistance groups, but at least one of them may be constituted as a resistance group.

Further, as explained above, the transistor PNP1 may be n transistors constituted to be connected in parallel, and the transistor PNP2 may similarly be m transistors constituted to be connected in parallel.

By switching the switch of the reference voltage VR1, a voltage having a primary temperature characteristic by the resistance R6 or the resistance R2 can be output to the reference voltage VR1.

Figure 19:
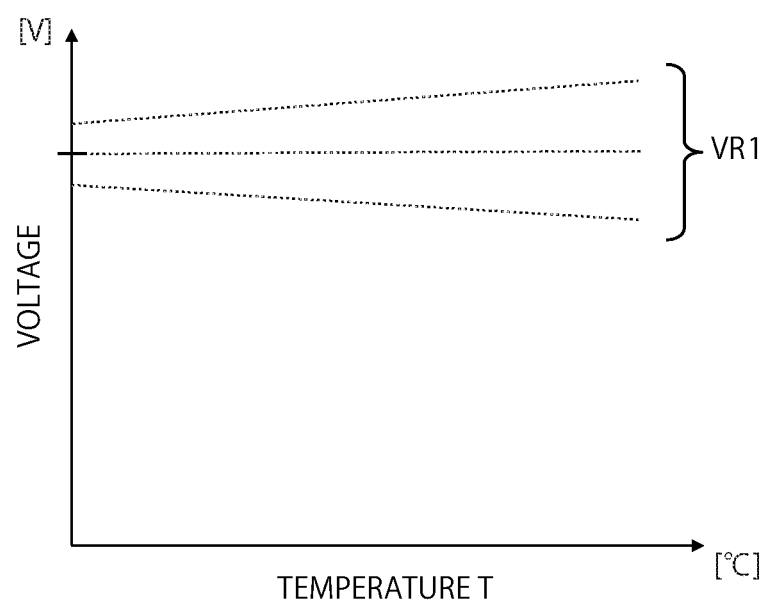
FIG. 19 is a graph illustrating an example of an output of a reference voltage circuitry according to an embodiment.

FIG. 19 is a chart illustrating the change in the reference voltage VR1 in this embodiment. By switching, for example, the switch relating to the reference voltage VR1 in FIG. 18, a BGR voltage to be output can be controlled to have a primary inclination with respect to a flat voltage of 1.2 V. For example, in the case of outputting based on a band gap of silicon, the voltage having a flat temperature characteristic of about 1.2 V can be controlled to have a temperature characteristic having an arbitrary inclination by the resistance R6 and the resistance R2.

Figure 20:
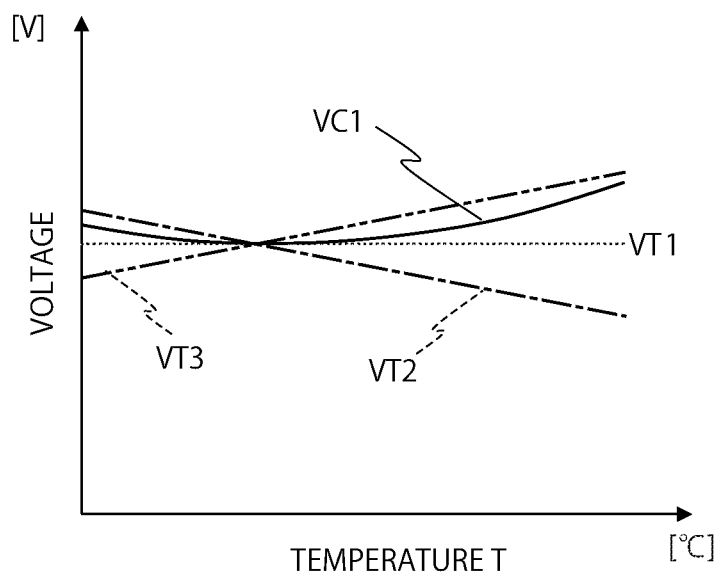
FIG. 20 is a graph illustrating an example of an output of a reference voltage circuitry according to an embodiment.
Figure 21:
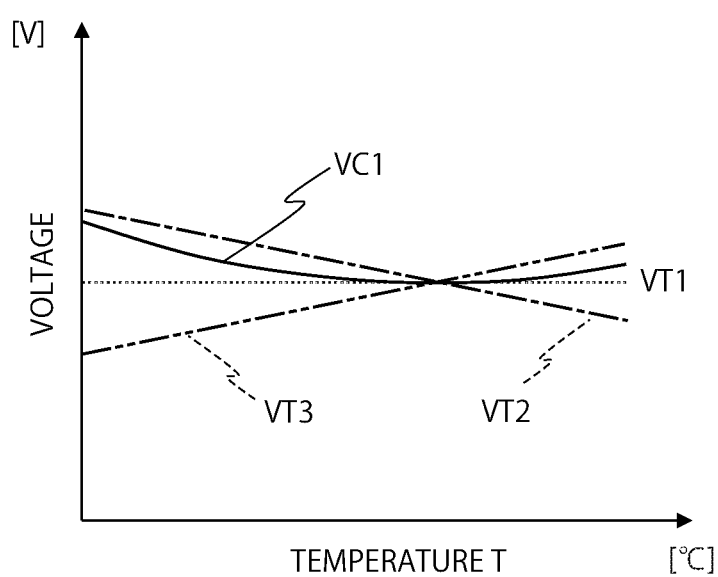
FIG. 21 is a graph illustrating an example of an output of a reference voltage circuitry according to an embodiment.

Further, when a resistance takeout position of the first voltage VT1 is coupled to the node on the upper side, the top of the protruding shape can be moved to a lower temperature side as illustrated in FIG. 20. Conversely, when the resistance takeout position of the first voltage VT1 is coupled to the node on the lower side, the top of the protruding shape can be moved to a higher temperature side as illustrated in FIG. 21.

As explained above, according to this embodiment, it becomes possible to control the primary temperature characteristic of the reference voltage VR1 output from the reference voltage circuitry, and to control the secondary temperature characteristic of the first voltage VT1. Therefore, it becomes possible to perform more freely and flexibly correction of the secondary temperature fluctuation in the oscillation frequency caused by the secondary temperature dependency of the output voltage of the BGR and by the secondary temperature characteristic of the resistance elements of the voltage-current conversion circuitry 40, and to acquire the oscillation frequency with higher accuracy.

Further, since the reference voltage VR1 and the first voltage VT1 are divided voltages of a series resistance of the resistances R6, R5, R4, the output voltage fluctuation occurring in the BGR occurs at the same ratio. In this case, the current IR1 is proportional to the reference voltage VR1, and offset based on the first voltage VT1 occurs in the fourth voltage VO1. Therefore, the variations are canceled out in the frequency control circuitry 50, and an oscillation frequency with less fluctuation is obtained. For example, when the voltage VR1 increases by 1% due to the fluctuation in power supply voltage, the current IR1 also increases by 1%, and the voltage VINT also increases by 1%. Since the voltage VT1 is influenced at the same ratio as that of the voltage VR1, the voltage VT1 also increases by 1% and the voltage VO1 also increases by 1%. As a result of this, the voltage increases are canceled out in the frequency control circuitry 50, so that the oscillation frequency with less fluctuation can be acquired.

In this case, the fluctuation due to the adjustment of the primary temperature characteristic of the voltage VR1 is not included in the voltage VO1. Further, the fluctuation due to the adjustment of the secondary temperature characteristic of the voltage VO1 is not included in the voltage VR1. Therefore, the first-order coefficient in the voltage VR1 and the correction of the second-order coefficient in the voltage VO1 are appropriately reflected in the respective outputs.

Fifth Embodiment

Figure 22:
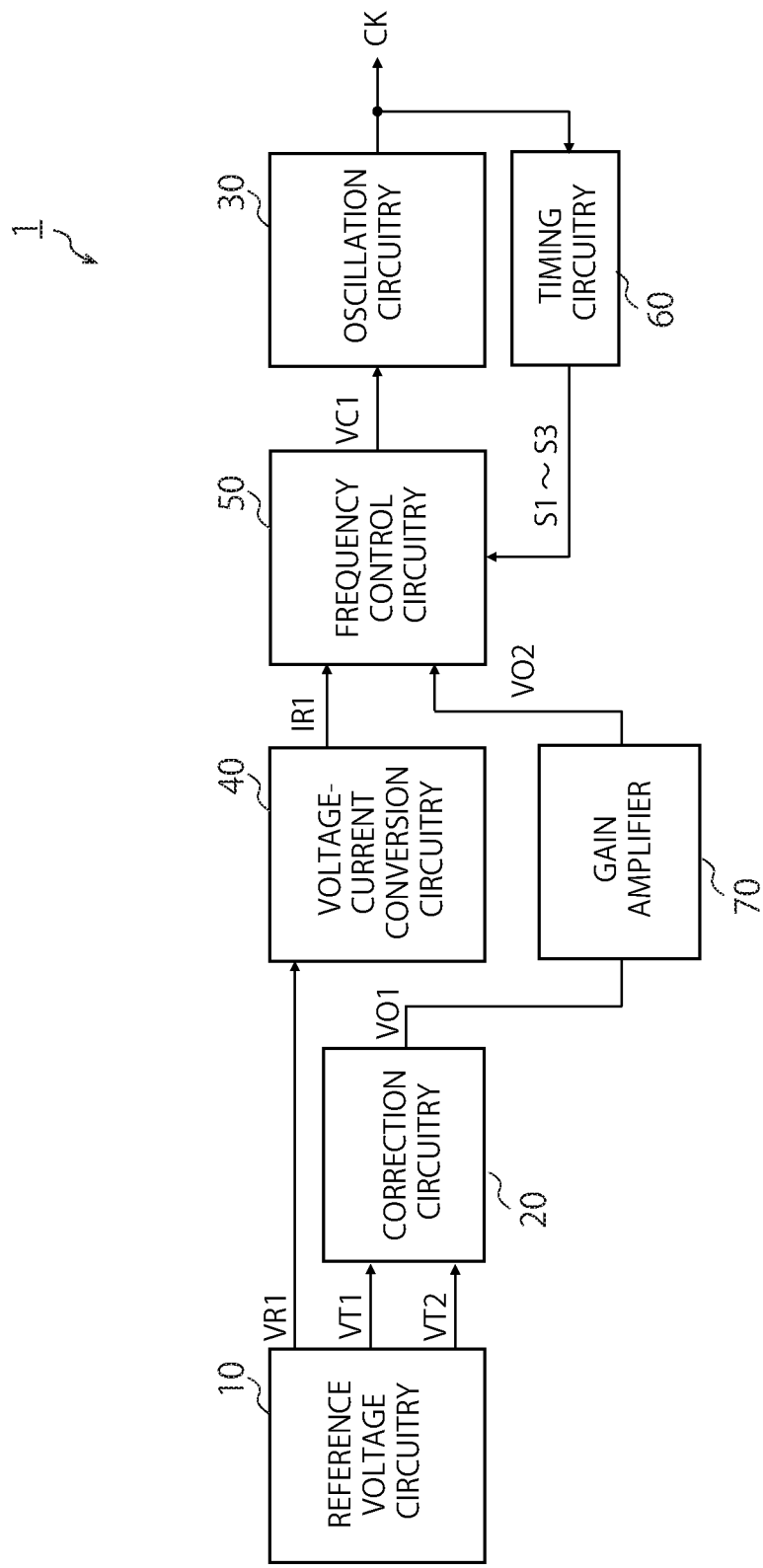
FIG. 22 is a block diagram schematically illustrating an oscillation apparatus according to an embodiment.

FIG. 22 is a block diagram schematically illustrating an oscillation apparatus 1 according to a fifth embodiment. The oscillation apparatus 1 includes the oscillation apparatus 1 according to the third embodiment or the fourth embodiment and further includes a gain amplifier 70 which adjusts the gain of the output of the correction circuitry 20.

The gain amplifier 70 outputs a voltage VO2 made by amplifying the fourth voltage VO1 output from the correction circuitry 20. The voltage VO2 is input into the frequency control circuitry 50.

Figure 23:
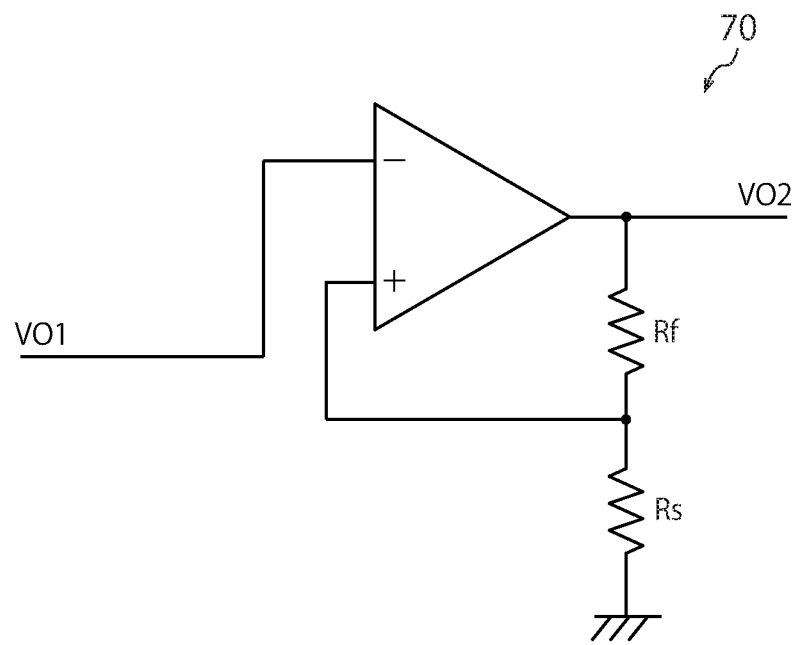
FIG. 23 is a circuitry diagram illustrating an example of a gain amplifier according to an embodiment.

FIG. 23 is a circuitry diagram illustrating an example of the gain amplifier according to this embodiment. The gain amplifier 70 includes an amplifier, and resistances Rf, Rs.

The noninverting input terminal of the amplifier is coupled to the voltage VO1. The output of the amplifier is grounded via the resistances Rf, Rs, and coupled to the noninverting input terminal via the resistance Rf. The gain amplifier 70 outputs a signal output from the amplifier.

By appropriately deciding the resistances Rf, Rs, the gain amplifier 70 amplifies the input voltage VO1 and outputs the amplified voltage.

Figure 24:
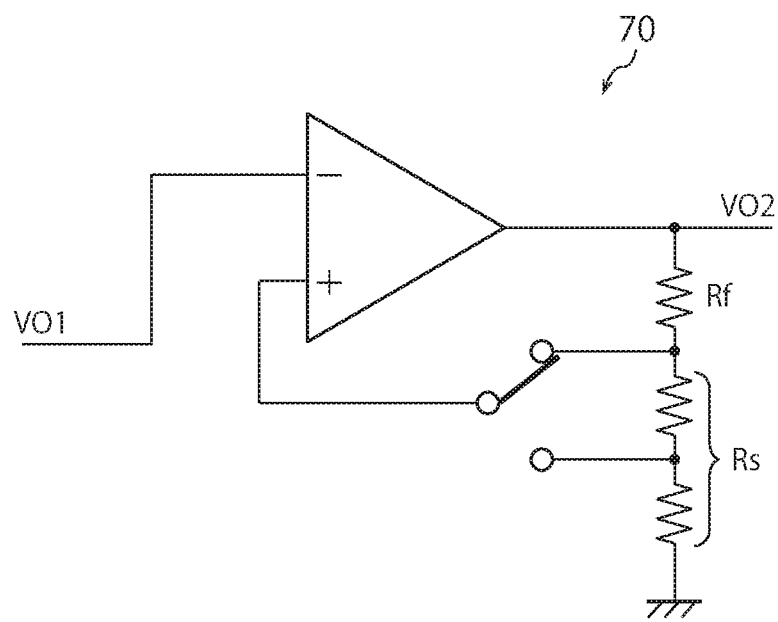
FIG. 24 is a circuitry diagram illustrating an example of a gain amplifier according to an embodiment.

FIG. 24 is a circuitry diagram illustrating another example of the gain amplifier. The gain amplifier 70 includes a resistance Rf composed of a plurality of resistances and a resistance Rs in a manner that the above resistances Rf, Rs can be switched, and may further include a switch which switches from which node of the resistance Rf feedback is performed to the noninverting input of the amplifier. For example, when coupling to the node on the upper side is made as in FIG. 24, the upper one resistance is selected as the resistance Rf and a combined resistance of the resistances on the lower side is selected as the resistance Rs. When coupling to the node on the lower side is made, a reverse state is established. Note that in FIG. 24, there are two nodes to be selected, but not limited to this, a plurality of, such as three or more, nodes may be provided and constituted as a variable resistance enabling more detailed setting.

The switching of the switch in the reference voltage circuitry 10 illustrated in FIG. 18 and the switching of the switch in the gain amplifier 70 in FIG. 24 may be combined to constitute the oscillation apparatus 1. For example, when the first voltage VT1 is set to be low in FIG. 18, the switch may be switched to increase the gain in the gain amplifier 70, and when the first voltage VT1 is set to be high, the switch may be switched to decrease the gain in the gain amplifier 70.

By switching as explained above, it becomes possible to perform control so that the voltage of the voltage VO2 made by amplifying the fourth voltage VO1 becomes a predetermined value irrespective of the gain.

As explained above according to this embodiment, it becomes possible to amplify the fourth voltage VO1 output from the correction circuitry 20 and to input it into the frequency control circuitry 50, In this case, similarly to the above fourth embodiment, the correction of the secondary temperature characteristic is appropriately reflected. Further, it is possible to set the magnitude of the voltage VINT in the frequency control circuitry 50 without depending on the voltage of the voltage VO1, thus making it possible to make the dynamic range wider than in the above embodiments, resulting in improved accuracy of the oscillation frequency and improved design easiness.

Sixth Embodiment

Figure 25:
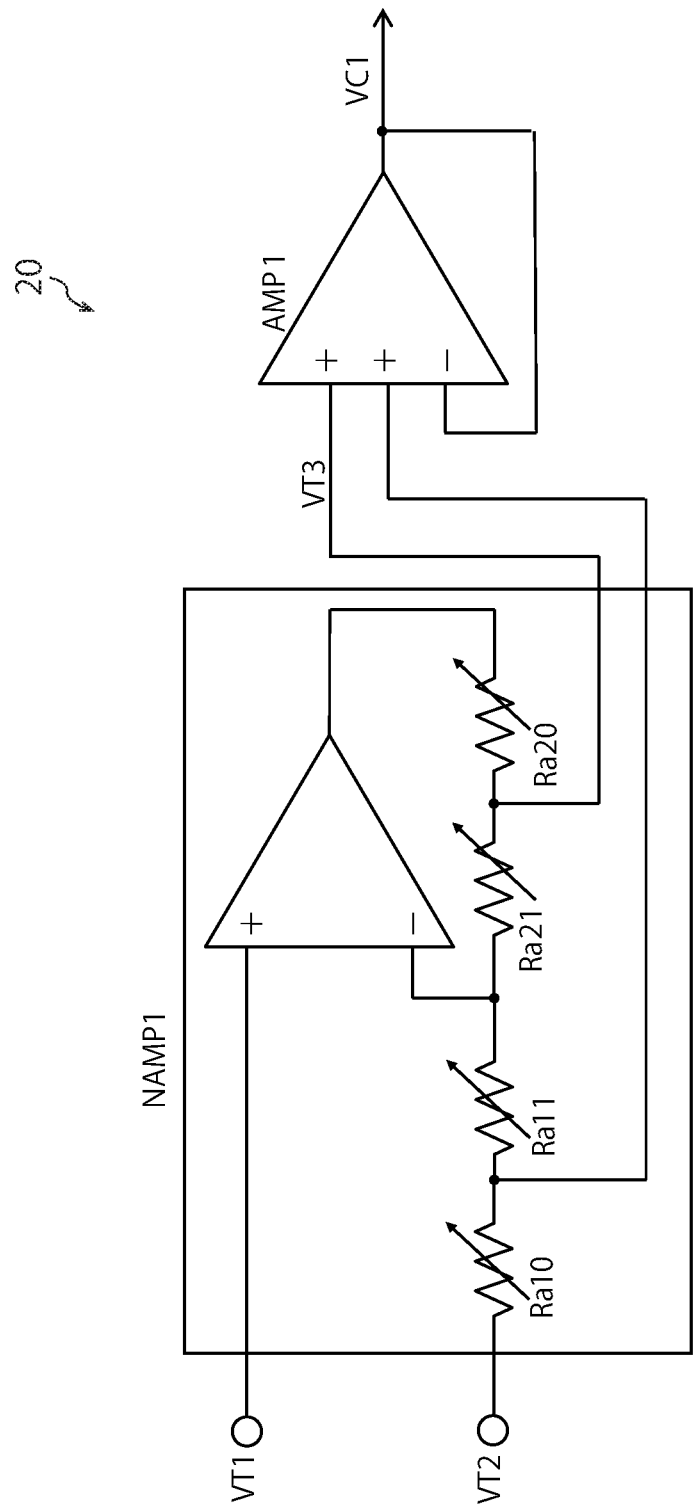
FIG. 25 is a circuitry diagram illustrating an example of a correction circuitry according to an embodiment.

FIG. 25 is a circuitry diagram illustrating an example of a correction circuitry 20 according to this embodiment. The correction circuitry 20 includes a first amplifier NAMP1 and a second amplifier AMP1.

The first amplifier NAMP1 includes an amplifier, first resistance groups Ra10, Ra11, and second resistance groups Ra20, Ra21. The first amplifier NAMP1 is an inverting amplifier which performs negative feedback to the amplifier by the first resistance groups Ra10, Ra11 and the second resistance groups Ra20, Ra21. The gain of the first amplifier NAMP1 is decided by a ratio between resistance values of Ra10 and Ra11 and by a ratio between resistance values of Ra20 and Ra21.

For example, the resistance values are set to Ra10=Ra20>>Ra11=Ra21 to decrease the gain. The first amplifier NAMP1 has a noninverting input terminal to which the first voltage VT1 is applied and an inverting input terminal to which the second voltage VT2 is applied, and outputs a third voltage VT3 which has a third temperature characteristic different from both of the first temperature characteristic and the second temperature characteristic. By decreasing the gain as explained above, the second voltage VT2 and the third voltage VT3 have equal voltage values. On the other hand, the second temperature characteristic and the third temperature characteristic are characteristics symmetric with respect to the first temperature characteristic.

The first amplifier NAMP1 outputs a voltage made by passing the second voltage VT2 through the resistance Ra10 as a new second voltage VT2 to the second amplifier AMP1. Further, the first amplifier NAMP1 outputs a voltage made by passing the fed back voltage through the resistance Ra20 as the third voltage VT3 to the second amplifier AMP1.

By generating the second voltage VT2 and the third voltage VT3 as explained above, it becomes possible to cancel out the voltage characteristic proportional to a square of the temperatures of the second voltage VT2 and the third voltage VT3 and to decrease also the influence of the voltage characteristic proportional to temperature at the timing when generating the fourth voltage VC1.

Figure 26:
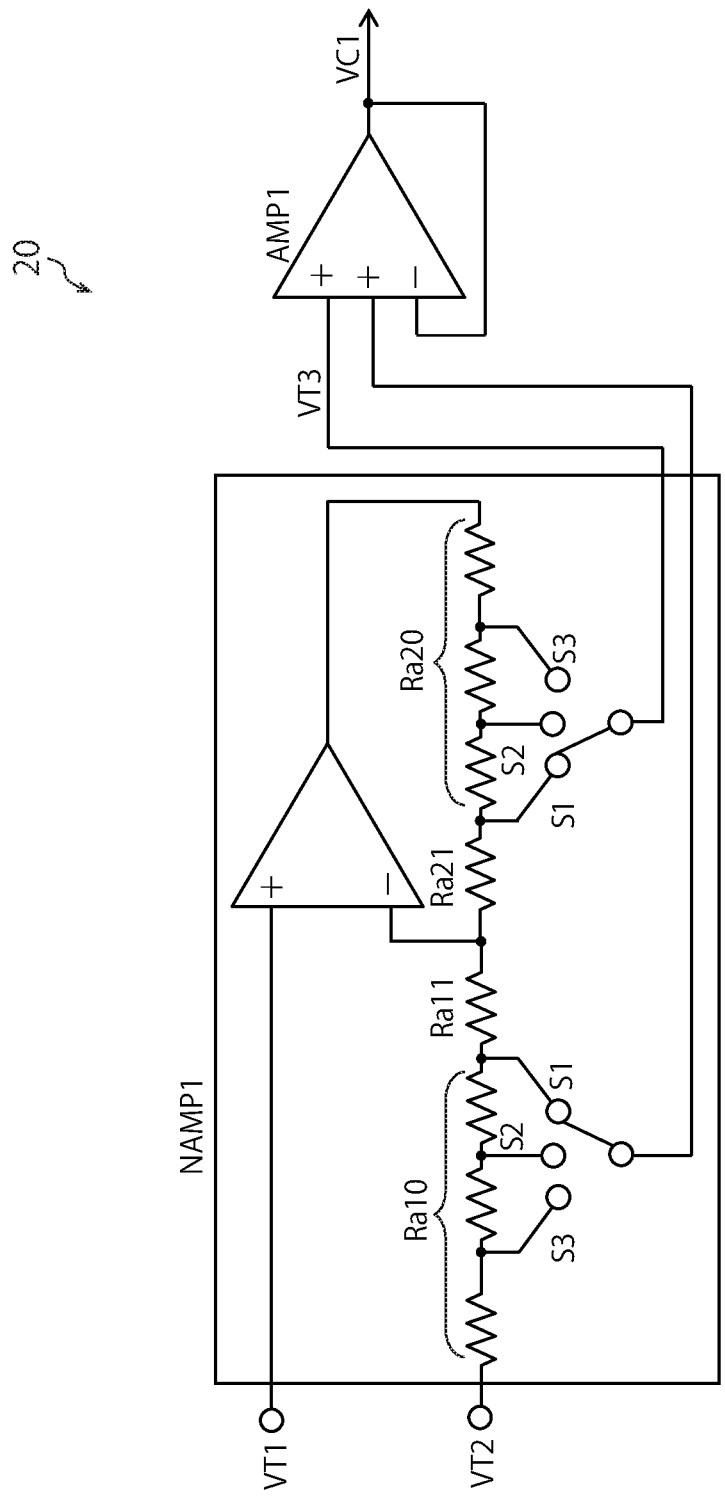
FIG. 26 is a circuitry diagram illustrating an example of a correction circuitry according to an embodiment.

FIG. 26 is a circuitry diagram illustrating an example of installation of the correction circuitry 20. For example, the first resistance group and the second resistance group have resistance groups each having three nodes and two switches each of which switches among the three nodes. The two switches operate in conjunction with each other, one of S1, S2, S3 in common to both the switches is selected to decide the voltage to be output. The resistances provided in the first resistance group and the second resistance group are provided such that their resistance values are symmetric with respect to the node between the first resistance group and the second resistance group. By grounding the resistances having the symmetry, the ratio between Ra10 and Ra11 and the ratio between Ra20 and Ra21 become equal.

For example, when both the switches are coupled to S1 as illustrated in FIG. 26, three resistances on the left are selected as the resistance Ra10 and one resistance on the right is selected as the resistance Ra11 in the first resistance group. Similarly, three resistances on the right are selected as the resistance Ra20 and one resistance on the left is selected as the resistance Ra21 in the second resistance group. By switching the switches to S2, S3, the resistance values can be switched to make the ratio between the resistances on the right and left equal.

Note that selection from the three nodes is made in FIG. 26, but not limited to this, selection from two nodes may be made, or selection from four nodes may be made. Further, the arrangement in FIG. 26 is illustrated only as an example, and the installation example of the variable resistances illustrated in FIG. 25 is not limited to this one. The variable resistances only needs to be installed as a circuitry which can appropriately obtain the equivalent temperature characteristic and set the ratio between the resistances.

Figure 27:
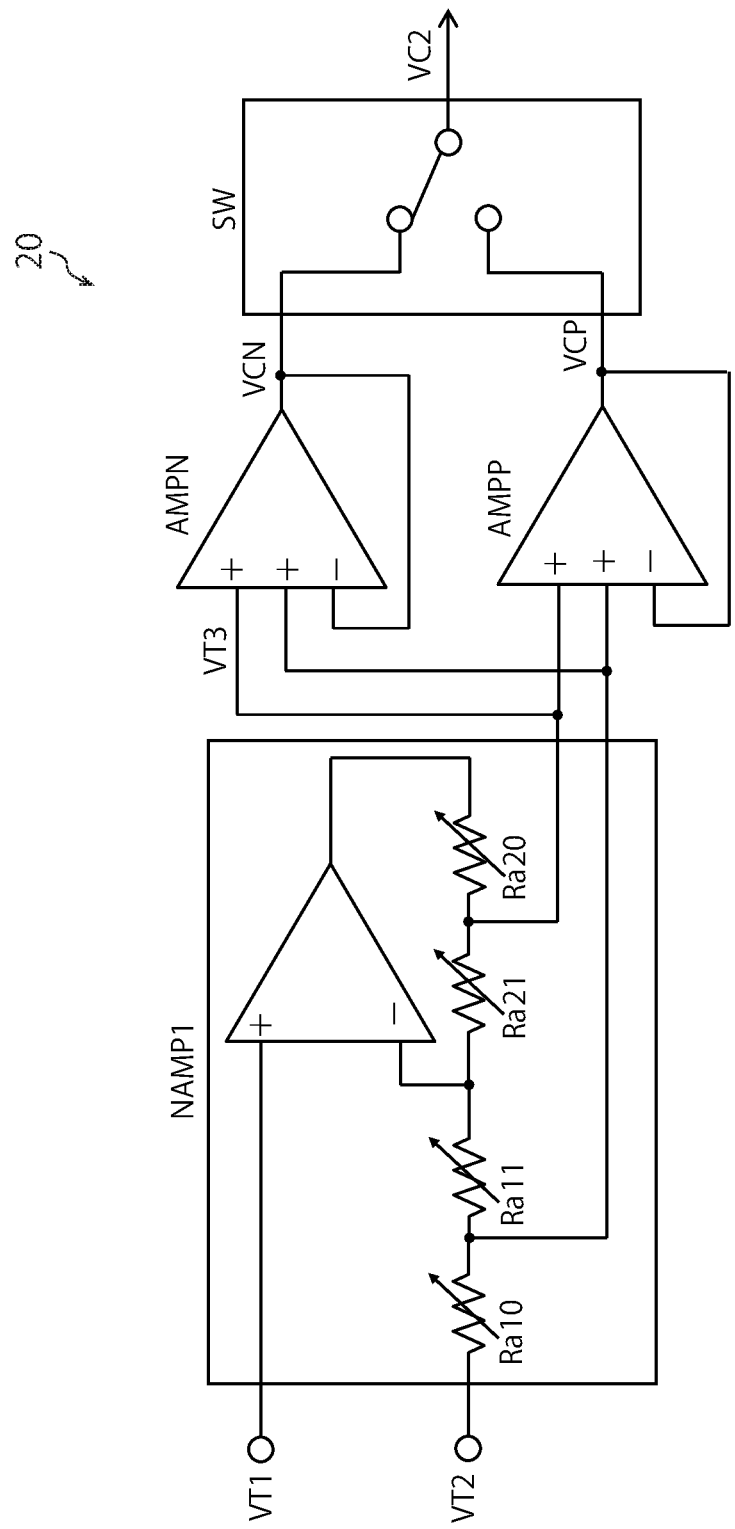
FIG. 27 is a circuitry diagram illustrating an example of a correction circuitry according to an embodiment.

FIG. 27 is a circuitry diagram illustrating still another example of the correction circuitry 20. Assuming that FIG. 26 corresponds to FIG. 4, FIG. 27 illustrates an example corresponding to FIG. 11. Thus, the first amplifier NAMP1 illustrated in FIG. 26 may replace the first amplifier NAMP1 illustrated in FIG. 11.

Seventh Embodiment

Figure 28:
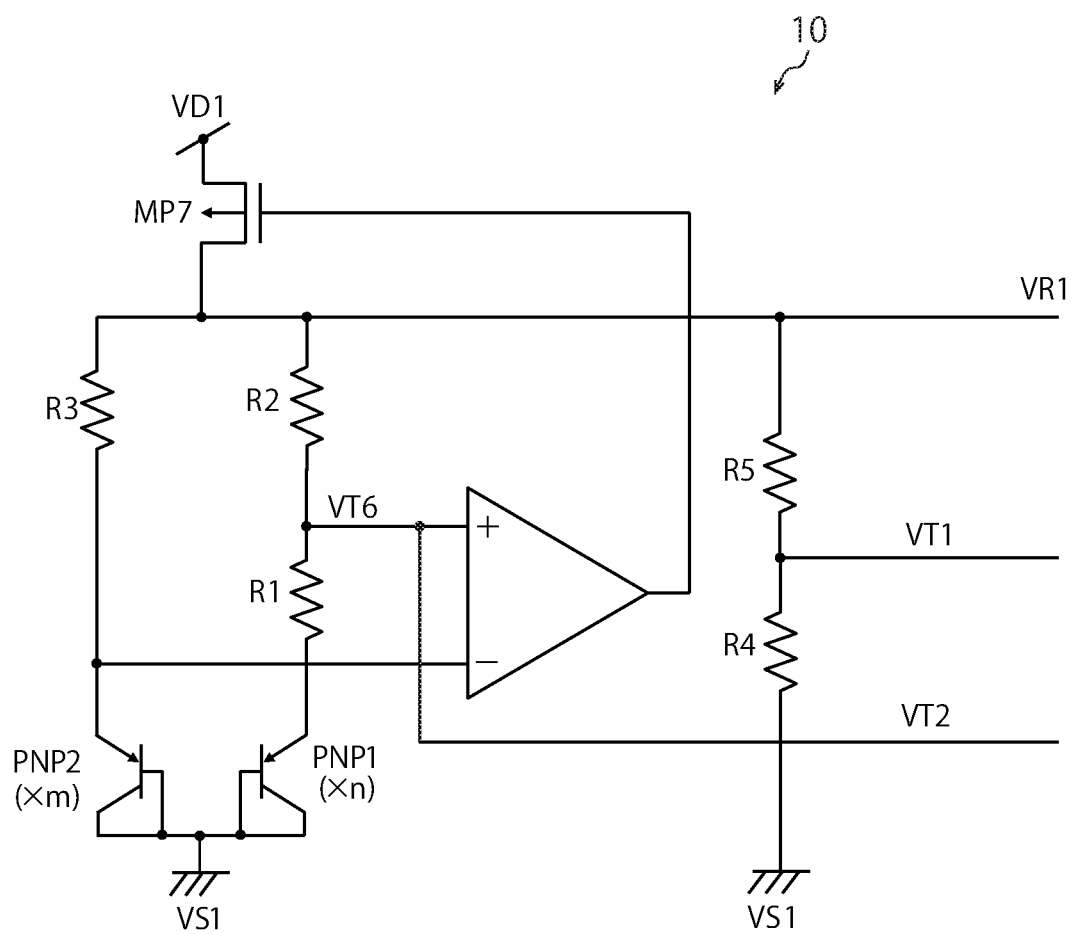
FIG. 28 is a circuitry diagram illustrating an example of a reference voltage circuitry according to an embodiment.

FIG. 28 is a circuitry diagram illustrating a reference voltage circuitry 10 according to this embodiment. As illustrated in FIG. 28, the reference voltage circuitry 10 may output a voltage applied to the node between the resistances R1 and R2, namely, the noninverting input terminal of a differential amplifier as the second voltage VT2 to have a temperature characteristic different from that of the first voltage VT1.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An oscillation apparatus comprising:
   a correction circuitry comprising:
      a first amplifier configured to amplify a difference between a first voltage having a first temperature characteristic and a second voltage having a second temperature characteristic different from the first temperature characteristic to generate a third voltage having a third temperature characteristic different from both the first temperature characteristic and the second temperature characteristic; and
      a second amplifier configured to amplify a difference between a sum of the second voltage and the third voltage, and, a feedback voltage, to generate a fourth voltage which corrects an oscillation frequency of an oscillation voltage; and
   an oscillation circuitry configured to output the oscillation voltage controlled in frequency based on the fourth voltage.

2. The oscillation apparatus according to claim 1, wherein the first amplifier comprises an inverting amplifier having a noninverting input terminal to which the first voltage is coupled, an inverting input terminal to which the second voltage is coupled via a first resistance group, and an output coupled to the inverting input terminal via a second resistance group having a resistance symmetric to a resistance of the first resistance group with respect to the inverting input terminal, and is configured to output new second voltage and third voltage from respective nodes obtained by dividing the first resistance group and the second resistance group by the same ratio from the inverting input terminal.

3. The oscillation apparatus according to claim 2, wherein:
a division point of the first resistance group is set so that the resistance group coupled to the second voltage is larger than the resistance group coupled to the inverting input terminal; and
a division point of the second resistance group is set so that the resistance group coupled to the output is larger than the resistance group coupled to the inverting input terminal.

4. The oscillation apparatus according to claim 1, wherein the first amplifier is an inverting amplifier having a noninverting input terminal to which the first voltage is coupled, an inverting input terminal to which the second voltage is coupled via a first resistance, and an output coupled to an inverting input terminal via a second resistance.

5. The oscillation apparatus according to claim 1, wherein the second amplifier amplifies a voltage so that the fourth voltage has a positive or negative offset with respect to the first voltage.

6. The oscillation apparatus according to claim 1, wherein:
the second amplifier amplifies a voltage so that the fourth voltage has a positive offset with respect to the first voltage; and
the oscillation apparatus further comprises:
a third amplifier configured to amplify a difference between a sum of the second voltage and the third voltage, and, a feedback voltage, to generate a fifth voltage which corrects the oscillation voltage, and configured to amplify a voltage so that the fifth voltage has a negative offset with respect to the first voltage; and
a switch configured to select an output of the second amplifier and an output of the third amplifier to output one of the fourth voltage and the fifth voltage to the oscillation circuitry.

7. The oscillation apparatus according to claim 1, further comprising:
a reference voltage circuitry configured to output a reference voltage, the first voltage, and the second voltage;
a voltage-current conversion circuitry configured to convert the reference voltage to a reference current;
a timing circuitry configured to output a timing signal based on the oscillation voltage output from the oscillation circuitry; and
a frequency control circuitry configured to output a voltage to be input into the oscillation circuitry based on the reference current, the fourth voltage, and the timing signal, wherein
the oscillation circuitry outputs the oscillation voltage having an oscillation frequency based on the voltage output from the frequency control circuitry.

8. The oscillation apparatus according to claim 7, further comprising a gain amplifier configured to amplify the fourth voltage wherein
the frequency control circuitry outputs a voltage to be input into the oscillation circuitry based on the reference current, the amplified fourth voltage, and the timing signal.

9. The oscillation apparatus according to claim 7, wherein the reference voltage circuitry performs control so that at least one of the reference voltage, the first voltage, and the second voltage is variable.

\* \* \* \* \*